(12) United States Patent
Yu et al.

(10) Patent No.: US 10,382,059 B2
(45) Date of Patent: Aug. 13, 2019

(54) TRANSMITTING APPARATUS, ENCODING METHOD THEREOF, RECEIVING APPARATUS, AND DECODING METHOD THEREOF

(71) Applicant: SAMSUNG ELECTRONICS CO., LTD., Suwon-si (KR)

(72) Inventors: Jung-pil Yu, Seongnam-si (KR);
Joo-sung Park, Suwon-si (KR);
Soon-chan Kwon, Incheon (KR);
Sung-il Park, Suwon-si (KR);
Chang-hoon Choi, Yongin-si (KR);
Jung-Il Han, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 130 days.

(21) Appl. No.: 14/308,977

(22) Filed: Jun. 19, 2014

(65) Prior Publication Data

US 2015/0012804 A1 Jan. 8, 2015

Related U.S. Application Data

(60) Provisional application No. 61/842,513, filed on Jul. 3, 2013.

(30) Foreign Application Priority Data

Sep. 27, 2013 (KR) .................. 10-2013-0115739

(51) Int. Cl.
*H04L 1/00* (2006.01)
*H03M 13/15* (2006.01)
(Continued)

(52) U.S. Cl.
CPC ..... *H03M 13/1515* (2013.01); *H03M 13/618* (2013.01); *H04L 1/0057* (2013.01);
(Continued)

(58) Field of Classification Search
CPC ............ H03M 13/253; H03M 13/256; H03M 13/2936; H03M 13/6538; H03M 13/1515;
(Continued)

(56) References Cited

U.S. PATENT DOCUMENTS 6,430,159 B1 8/2002 Wan et al.
7,050,511 B2 * 5/2006 Jeong .................... H04L 1/0041
375/265
(Continued)

FOREIGN PATENT DOCUMENTS

CN 101310533 A 11/2008
JP 2006-238129 A 9/2006
(Continued)

OTHER PUBLICATIONS

Communication dated Sep. 19, 2014 issued by the European Patent Office in counterpart European Patent Application No. 14175265.9.
(Continued)

*Primary Examiner* — April Y Blair
*Assistant Examiner* — Sazzad Hossain
(74) *Attorney, Agent, or Firm* — Sughrue Mion, PLLC

(57) ABSTRACT

Apparatuses and methods for encoding, transmitting, receiving and decoding signal frames are provided. A transmitting apparatus includes: a frame encoder configured to perform Reed Solomon (RS) encoding on a plurality of frames in a vertical direction, wherein the frame encoder divides the plurality of frames into a plurality of groups, performs RS encoding for each group so that parities are added after the last frame of each group, and generates the RS-encoded frames. A receiver includes: a frame decoder configured to perform RS decoding on a plurality of received frames in a vertical direction, wherein the frame decoder divides the
(Continued)

plurality of received frames into a plurality of groups, and performs RS decoding for each group to obtain information words without the parities.

34 Claims, 23 Drawing Sheets

(51) Int. Cl.
    *H03M 13/00* (2006.01)
    *H03M 13/25* (2006.01)
    *H03M 13/29* (2006.01)

(52) U.S. Cl.
    CPC ......... *H04L 1/0066* (2013.01); *H03M 13/251* (2013.01); *H03M 13/2906* (2013.01); *H04L 1/0007* (2013.01); *H04L 1/0061* (2013.01)

(58) Field of Classification Search
    CPC .... H03M 13/618; H03M 13/09; H03M 13/15; H03M 13/32; H03M 13/23; H03M 13/2732; H03M 13/2909; H03M 13/293; H03M 13/251; H03M 13/2906; H04L 1/0057; H04L 1/0061; H04L 1/0007; H04L 1/0066
    See application file for complete search history.

(56) References Cited

U.S. PATENT DOCUMENTS

| | | | | |
|---|---|---|---|---|
| 7,310,376 | B2* | 12/2007 | Wang | H04N 19/105 375/240.02 |
| 7,555,696 | B2* | 6/2009 | Schmidt | H03M 13/255 714/758 |
| 7,792,135 | B2 | 9/2010 | Yu | |
| 7,839,950 | B2* | 11/2010 | Choi | H04N 7/173 375/265 |
| RE42,301 | E | 4/2011 | Limberg | |
| 8,094,727 | B2* | 1/2012 | Hong | H04N 21/235 375/238 |
| 8,149,948 | B2* | 4/2012 | Song | H03M 13/2721 375/240.01 |
| 8,307,256 | B2 | 11/2012 | Lee et al. | |
| 8,365,034 | B2 | 1/2013 | Kim et al. | |
| 8,670,437 | B2* | 3/2014 | Walker | H04L 1/0041 348/14.01 |
| 2003/0043749 | A1 | 3/2003 | Tanaka et al. | |
| 2003/0101406 | A1 | 5/2003 | Song | |
| 2004/0261001 | A1 | 12/2004 | Chang et al. | |
| 2006/0085727 | A1* | 4/2006 | Azenkot | H04L 5/02 714/792 |
| 2007/0088971 | A1 | 4/2007 | Walker et al. | |
| 2008/0069118 | A1* | 3/2008 | Monier | G01D 4/004 370/400 |
| 2008/0155376 | A1 | 6/2008 | Williams et al. | |
| 2010/0005364 | A1* | 1/2010 | Higurashi | H03M 13/2945 714/755 |
| 2010/0037120 | A1 | 2/2010 | Limberg | |
| 2011/0044316 | A1 | 2/2011 | Kim et al. | |
| 2011/0154161 | A1 | 6/2011 | Kim et al. | |
| 2011/0173511 | A1 | 7/2011 | Miyata et al. | |
| 2012/0236922 | A1* | 9/2012 | Jeong | H03M 13/2721 375/232 |
| 2013/0077608 | A1* | 3/2013 | Amini | H04L 1/0041 370/337 |
| 2013/0114745 | A1* | 5/2013 | Lee | H04L 1/0071 375/240.27 |
| 2014/0047297 | A1* | 2/2014 | Shin | H03M 13/2721 714/758 |
| 2014/0211884 | A1* | 7/2014 | Lee | H04L 1/0071 375/296 |

FOREIGN PATENT DOCUMENTS

| | | |
|---|---|---|
| KR | 10-0611956 A | 8/2006 |
| KR | 10-2008-0090726 A | 10/2008 |
| KR | 10-2009-0010702 A | 1/2009 |
| KR | 10-2011-0070417 A | 6/2011 |
| WO | 2009/014403 A2 | 1/2009 |

OTHER PUBLICATIONS

International Search Report dated Oct. 28, 2014 issued by the International Searching Authority in counterpart International Patent Application No. PCT/KR2014/005954 (PCT/ISA/210).
Written Opinion dated Oct. 28, 2014 issued by the International Searching Authority in counterpart International Patent Application No. PCT/KR2014/005954 (PCT/ISA/237).
Grace Oletu, et al; "Wireless Video Distribution to Handheld Devices"; Packet Video 2007; Nov. 2007; XP031170635; pp. 363-369 (7 pages total).
Communication dated Feb. 12, 2016, issued by the European Patent Office in counterpart European Application No. 14175265.9.
Communication dated Dec. 14, 2017, from the European Patent Office in counterpart European Application No. 14175265.9.
Communication dated Mar. 5, 2018, issued by the State Intellectual Property Office of P.R. China in counterpart Chinese application No. 201410315991.2.
Communication dated May 28, 2019, issued by the Korean Patent Office in counterpart Korean Application No. 10-2013-0115739.

\* cited by examiner

700

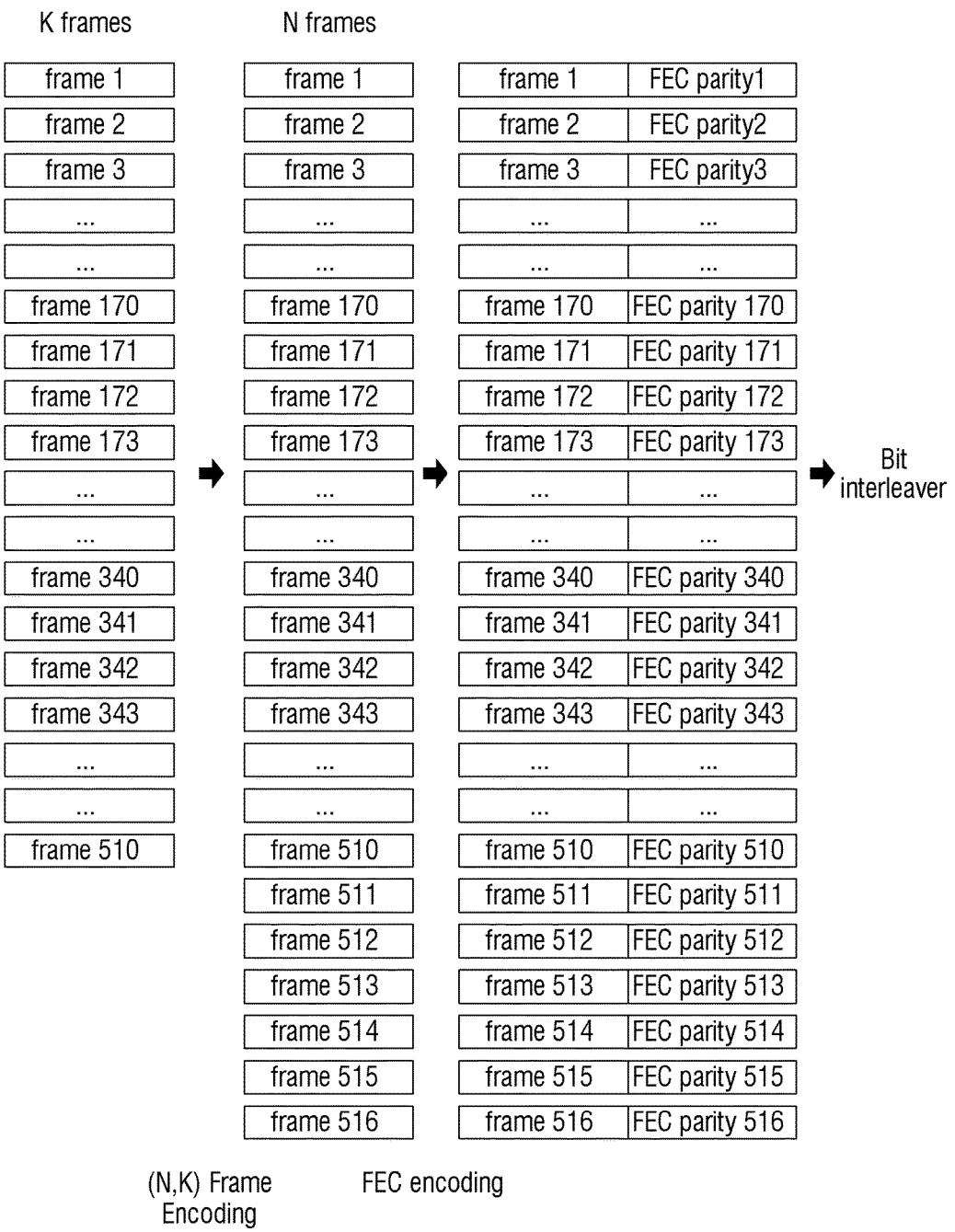

TRANSMITTING APPARATUS, ENCODING METHOD THEREOF, RECEIVING APPARATUS, AND DECODING METHOD THEREOF

CROSS-REFERENCE TO RELATED APPLICATION

This application claims priority from U.S. Provisional Patent Application No. 61/842,513, filed on Jul. 3, 2013, in the United States Patent and Trademark Office, and Korean Patent Application No. 10-2013-0115739, filed on Sep. 27, 2013, in the Korean Intellectual Property Office, the disclosure of which is incorporated herein in its entirety by reference.

BACKGROUND OF THE INVENTION

1. Field of the Invention

Apparatuses and methods consistent with exemplary embodiments of the inventive concept relate to transmitting, encoding, receiving and decoding data on a frame level.

2. Description of the Related Art

The quality of digital communication can be dramatically improved by applying error correction technologies. The error correction technologies have been developed initially from the block encoding now to the repeated demodulation coding such as low density parity check (LDPC) encoding and turbo encoding.

However, even though a strongest error correction technology is used, it is difficult to restore received signals when most of the received signals are extremely distorted. In this case, if most received signals which are temporally concentrated and distorted can be made temporally uniform, the possibility of restoration using the error correction encoding technology may increase. This is referred to as a time diversity gain.

In order to increase the time diversity gain, a receiver may store a large amount of data and perform decoding on a frame level gathering a predetermined amount of bits. For example, the Reed-Solomon (RS) encoding may be used for the error correction technology used on the frame level.

However, in an RS encoding defined in a specific Galois field, there is a problem that the amount capable of coding and decoding at a time is limited.

SUMMARY

One or more exemplary embodiments of the inventive concept overcome the above disadvantages and other disadvantages not described above. Also, the inventive concept is not required to overcome the disadvantages described above, and the exemplary embodiments of the inventive concept may not overcome any of the problems described above.

One or more exemplary embodiments of the inventive concept provide a transmitting apparatus, an encoding method thereof, a receiving apparatus, and a decoding method thereof which are capable of encoding and decoding data which is more than a predetermined amount processed using an RS code defined in a specific Galois field.

According to an aspect of an exemplary embodiment of the inventive concept, there is provided a transmitting apparatus which may include: a frame encoder configured to perform RS encoding on a plurality of frames in a vertical direction, wherein the frame encoder divides the plurality of frames into a plurality of groups, performs RS encoding for each group so that parities are added after the last frame of each group, and generates the RS-encoded frames.

The frame encoder may divide the plurality of frames into the plurality of groups based on a maximum number of frames that can be generated by RS encoding which is defined in a predetermined Galois field.

The frame encoder may divide the plurality of frames into the plurality of groups if it is determined that a number of frames to be RS encoded by the frame encoder is greater than a maximum number of frames that can be generated by RS encoding which is defined in a predetermined Galois field.

The frame encoder may calculate the number of the groups to divide the plurality of frames using a mathematical formula as below.

$$B = \left\lfloor \frac{N}{N'} \right\rfloor + 1,$$

where B is the number of the groups to divide the plurality of frames, N is the number of frames to be RS encoded by the frame encoder, and N' is the maximum number of frames that can generated by RS encoding which is defined in the predetermined Galois field.

The frame encoder may perform RS encoding on at least one frame included in the each group in the vertical direction.

The frame encoder may interleave the RS-encoded frames if it is determined that the plurality of frames are divided into the plurality of groups and are RS encoded.

The frame encoder may generate at least one RS-encoded frame for the each group by performing RS encoding on at least one frame included in the each group, and perform interleaving by sequentially reading the at least one RS-encoded frame from the each group.

The frame encoder may generates the at least one RS-encoded frame for the each group by performing RS encoding on the at least one frame included in the each group, and perform interleaving by giving an index to the at least one RS-encoded frame for the each group and changing the index of the at least one RS-encoded frame for the each group based on a mathematical formula as below.

$$i = (p \times j + D_{j \bmod Q}) \bmod N,$$

where i is the index before the interleaving, j is the index after the interleaving, and P, Q, $D_0$, $D_1$, $D_2$, . . . , and $D_{Q-1}$ are predetermined parameters.

The transmitting apparatus may further include a forward error correction (FEC) encoder configured to perform FEC encoding on the RS-encoded frames.

The transmitting apparatus may further include a constellation mapper configured to map bits of the FEC-encoded frames onto cells, and a time interleaver configured to interleave the cells mapped with the bits of the FEC-encoded frames, wherein the frame encoder determines the number of frames to be RS encoded by the RS encoding, based on a time interleaving rule.

According to an aspect of another exemplary embodiment of the inventive concept, there is provided a receiving apparatus which may include: a frame decoder configured to perform Reed Solomon (RS) decoding on a plurality of frames received from a transmitting apparatus, in a vertical direction, wherein the frame decoder divides the plurality of received frames into a plurality of groups, and performs RS decoding for each group to obtain information words without parities added after the last frame of each group.

The frame decoder may divide the plurality of received frames into the plurality of groups based on a number of groups that divided a plurality of frames at the transmitting apparatus for RS encoding for the each group, and performs the RS decoding for the each group.

The frame decoder may deinterleave the plurality of received frames if it is determined that the transmitting apparatus has divided a plurality of frames into the plurality of groups and performed RS encoding for the each group so that parities are added after the last frame of the each group.

The receiving apparatus may further include a forward error correction (FEC) decoder configured to perform FEC decoding on the plurality of received frames before the frame decoder performs the RS decoding on the plurality of received frames.

The frame decoder may acquire information about a frame having an error among the plurality of frames based on a result of the FEC decoding, and performs the RS decoding on the plurality of frames using the information about the frame having the error.

According to an aspect of still another exemplary embodiment of the inventive concept, there is provided an encoding method which may include: performing RS encoding on a plurality of frames in a vertical direction, wherein the performing the RS encoding includes: dividing the plurality of frames into a plurality of groups; and RS encoding for each group so that parities are added after the last frame of each group to generate RS-encoded frames.

The dividing the plurality of frames into the plurality of groups may be performed based on a maximum number of frames that can be generated by RS encoding which is defined in a predetermined Galois field.

The dividing the plurality of frames into the plurality of groups may be performed if it is determined that a number of frames to be RS encoded is greater than a maximum number of frames that can be generated by RS encoding which is defined in a predetermined Galois field.

The number of the groups to divide the plurality of frames may be calculated using a mathematical formula as below.

$$B = \left\lfloor \frac{N}{N'} \right\rfloor + 1,$$

where B is the number of the groups to divide the plurality of frames, N is the number of frames to be RS encoded, and N' is the maximum number of frames that can be generated by RS encoding which is defined in the predetermined Galois field.

The RS encoding may be performed on at least one frame included in the each group, in the vertical direction.

The RS-encoded frames may be interleaved if it is determined that the plurality of frames are divided into the plurality of groups and are RS-encoded.

The RS encoding may be performed such that at least one RS-encoded frame for each group is generated by performing RS encoding for at least one frame included in the each group, and interleaving is performed by sequentially reading the at least one RS-encoded frame from the each group.

The RS encoding may be performed such that the at least one RS-encoded frame for the each group is generated by performing RS encoding on the at least one frame included in the each group, and interleaving is performed by giving an index to the at least one RS-encoded frame for the each group and changing the index of the at least one RS-encoded frame for the each group based on a mathematical formula as below.

$$i = (p \times j + D_{j \bmod Q}) \bmod N,$$

wherein i is the index before the interleaving, j is the index after the interleaving, and P, Q, $D_0$, $D_1$, $D_2$, . . . , and $D_{Q-1}$ are predetermined parameters.

The method may further include performing FEC encoding on the RS-encoded frames.

The method may further include mapping bits of the FEC-encoded frames onto cells, and interleaving the cells mapped with the bits of the FEC-encoded frames, wherein a number of frames to be RS encoded by the RS encoding is determined based on a time interleaving rule.

According to an aspect of still another exemplary embodiment of the inventive concept, there is provided a decoding method which may include: performing Reed Solomon (RS) decoding on a plurality of frames received from a transmitting apparatus, in a vertical direction, wherein the performing the RS decoding includes: dividing the received frames into a plurality of groups; and RS decoding for each group to obtain information words without parities added after the last frame of each group.

The dividing the plurality of received frames may include dividing the RS-encoded frames into the plurality of groups based on the number of groups that divided a plurality of frames at the transmitting apparatus for RS encoding for the each group.

The method may further include deinterleaving the plurality of received frames if it is determined that the transmitting apparatus has divided a plurality of frames into the plurality of groups and performed RS encoding for the each group so that parities are added after the last frame of the each group.

The method may further include performing FEC decoding on the plurality of received frames prior to the RS decoding on the plurality of received frames.

The method may further include acquiring information about a frame having an error among the plurality of received frames based on a result of the FEC decoding, wherein the acquired information is used for the RS decoding on the plurality of received frames.

According to the above exemplary embodiments of the inventive concept, error correction may be enabled on the frame level so that reliable data can be transmitted or received.

Additional and/or other aspects and advantages of the inventive concept will be set forth in part in the description which follows and, in part, will be obvious from the description, or may be learned by practice of the inventive concept.

BRIEF DESCRIPTION OF THE DRAWING FIGURES

The above and/or other aspects of the inventive concept will be more apparent by describing certain exemplary embodiments thereof with reference to the accompanying drawings, in which:

FIG. 13 is a drawing to describe an FEC encoding method according to an exemplary embodiment of the inventive concept;

DETAILED DESCRIPTION OF THE EXEMPLARY EMBODIMENTS

Figure 1:
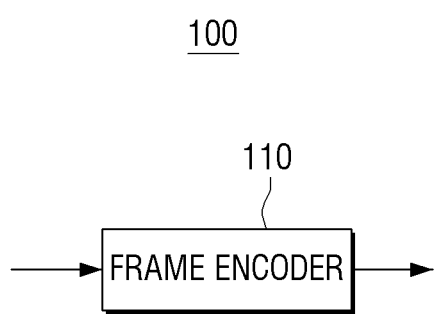
FIG. 1 illustrates a configuration of a transmitting apparatus according to an exemplary embodiment of the inventive concept.

Certain exemplary embodiments of the inventive concept will now be described in greater detail with reference to the accompanying drawings.

In the following description, same drawing reference numerals are used for the same elements even in different drawings. The matters defined in the description, such as detailed construction and elements, are provided to assist in a comprehensive understanding of the inventive concept. Thus, it is apparent that the exemplary embodiments of the inventive concept can be carried out without those specifically defined matters. Also, well-known functions or constructions are not described in detail since they would obscure the inventive concept with unnecessary detail.

FIG. 1 is a block diagram of a configuration of a transmitting apparatus according to an exemplary embodiment of the inventive concept. With reference to FIG. 1, the transmitting apparatus (or transmitter) 100 may include a frame encoder 110. Although additional elements or components such as a constellation mapper and a modulator may be included in the transmitting apparatus 100, they are omitted in FIG. 1 for brevity of describing the frame encoder 110.

The frame encoder 110 performs Reed-Solomon (RS) encoding on a plurality of frames in a vertical direction. The plurality of frames may include information words to be transmitted. Each frame includes a plurality of bits. For example, the frames may be baseband (BB) frames. The BB frames may have the same format as defined in the Digital Video Broadcasting-Terrestrial Version 2 (DVB-T2) standard or the Advanced Television Systems Committee (ATSC) 3.0 standard which is currently being established. Here, the vertical direction is a direction perpendicular to bit arrangement in a frame when the plurality of frames are stacked frame by frame.

In other words, the frame encoder 110 may receive the plurality of frames each of which includes a plurality of bits, perform RS encoding in the vertical direction, and add parities to vertical ends of the plurality of frames. In this case, since the plurality of frames are encoded in the vertical direction, the parities generated by the RS encoding may have the same format as the frames.

As described above, the frame encoder 110 may generate the plurality of RS-encoded frames by performing RS encoding on the plurality of frames in the vertical direction, and perform RS encoding throughout the plurality of frames on a frame level.

Alternatively, the frame encoder 110 may generate the plurality of RS-encoded frames by dividing the plurality of frames into a plurality of groups and performing RS encoding on each group. Specifically, the frame encoder 110 may divide the plurality of frames into the plurality of groups based on the maximum number of frames that can be generated by RS encoding which is defined in a predetermined Galois field.

The predetermined Galois field is a field defined as $GF(2^m)$, indicating a finite field having the number of elements, $2^m$. Herein, m is a positive integer, indicating a value for field extension of $GF(2^m)$ to perform RS encoding.

A maximum number of frames that can be generated by RS encoding which is defined in the $GF(2^m)$ field is determined according to the value "m". Specifically, the maximum number of frames that can be generated by RS encoding is limited to $2^m-1$ or lower.

Accordingly, when the number of frames to be RS encoded is greater than the maximum number of frames that can be generated by RS encoding which is defined in the predetermined Galois field, the frame encoder 110 may divide the frames into a plurality of groups and perform RS encoding on each divided group.

The RS-encoded frames include the plurality of frames, at least one frame including a parity generated by RS encoding. The number of the RS-encoded frames may be determined according to a code rate. RS encoding may be expressed as a form such as RS(N, K) wherein N is the number of the entire RS-encoded frames (i.e., frames output after RS encoding), K is the number of the entire frames on which the RS encoding is performed (i.e., frames input for RS encoding).

Specifically, when the plurality of frames are RS encoded in the vertical direction, the maximum number of frames that can be generated by RS encoding in the $GF(2^m)$ field is $(2^m-1)$. Accordingly, when the number of frames to be RS encoded is greater than $(2^m-1)$, the frame encoder 110 divides the plurality of frames into a plurality of groups, and perform RS encoding on each group.

In this case, when the plurality of frames are RS encoded in the vertical direction, the RS encoding may be performed on a symbol basis which constitutes each frame. Each symbol may include m bits defined in the $GF(2^m)$ field.

The frame encoder 110 may calculate the number of groups dividing the plurality of frames using mathematical formula 1 as below.

$$B = \left\lfloor \frac{N}{N'} \right\rfloor + 1, \quad (1)$$

where B is the number of the groups, and N is the number of frames to be RS encoded. N' is the maximum number of frames that can be generated by RS encoding which is defined in the predetermined Galois field, and may become $2^m-1$ as described above. In addition, $\lfloor \ \rfloor$ is a floor operator. That is, $\lfloor x \rfloor$ is a maximum integer less than x.

In order to divide the plurality of frames into the plurality of groups, the frame encoder 110 may additionally set diverse parameters as well as the number of groups that divides the plurality of frames.

Specifically, the frame encoder 110 may set parameters such as m which is defined in the $GF(2^m)$ field, K which is the number of the frames to perform RS encoding, and N which is the number of frames to be RS encoded.

In addition, when the plurality of frames are divided into the plurality of groups, the frame encoder 110 may set the number of frames on which RS encoding is to be performed in each group, and the number of RS-encoded frames in each group. For example, when i is 1, 2, . . . , and B, the number of frames on which RS encoding is to be performed in each group may be expressed as $K_i$, and the number of RS-encoded frames in each group may be expressed as $N_i$. In this case, $N_i$ and $K_i$ may be set to satisfy $N=N_1+N_2+\ldots+N_B$ and $K=K_1+K_2+\ldots+K_B$.

Subsequently, the frame encoder 110 may divide the plurality of frames into the plurality of groups in the aforementioned method, and perform RS encoding on at least one frame included in each group in the vertical direction.

In this case, since the plurality of frames are divided into the plurality of groups, the number of times being RS encoded may be the same as the number of the groups. For example, when the plurality of frames are divided into B groups, RS encoding is performed B times for $K_i$ frames using the $RS(N_i, K_i)$ code, (i=1, 2, . . . , B).

The frame encoder 110 may perform RS encoding without dividing the plurality of frames into the plurality of groups. That is, when the number of frames to be RS encoded is less than the maximum number of frames that can be generated by RS encoding which is defined in the predetermined Galois field, the frame encoder 110 may perform RS encoding on the plurality of frames without dividing the plurality of frames into the plurality of groups.

As described above, the frame encoder 110 may generate the RS encoded frames by or without dividing the plurality of frames into the plurality of groups.

More detailed description is provided below with reference to FIGS. 2 and 3.

Figure 2:
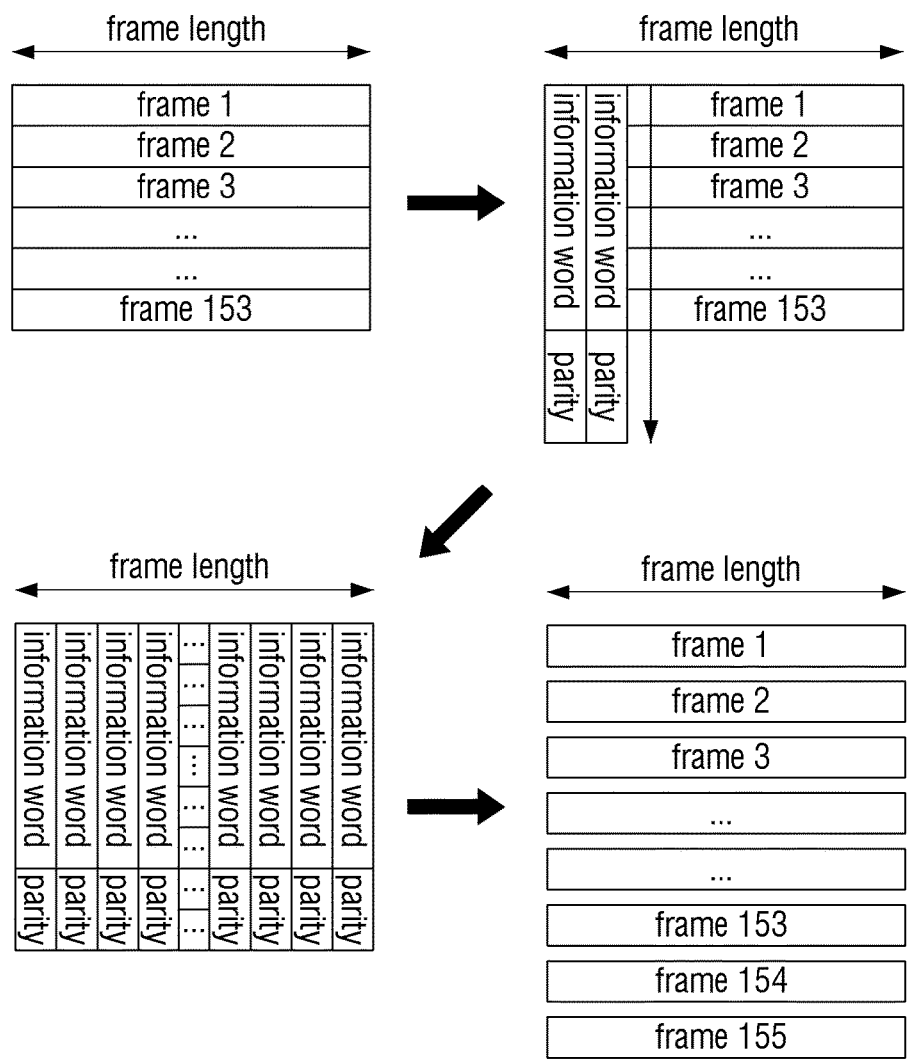
FIGS. 2 and 3 illustrate RS encoding according to exemplary embodiments of the inventive concept.
Figure 3:
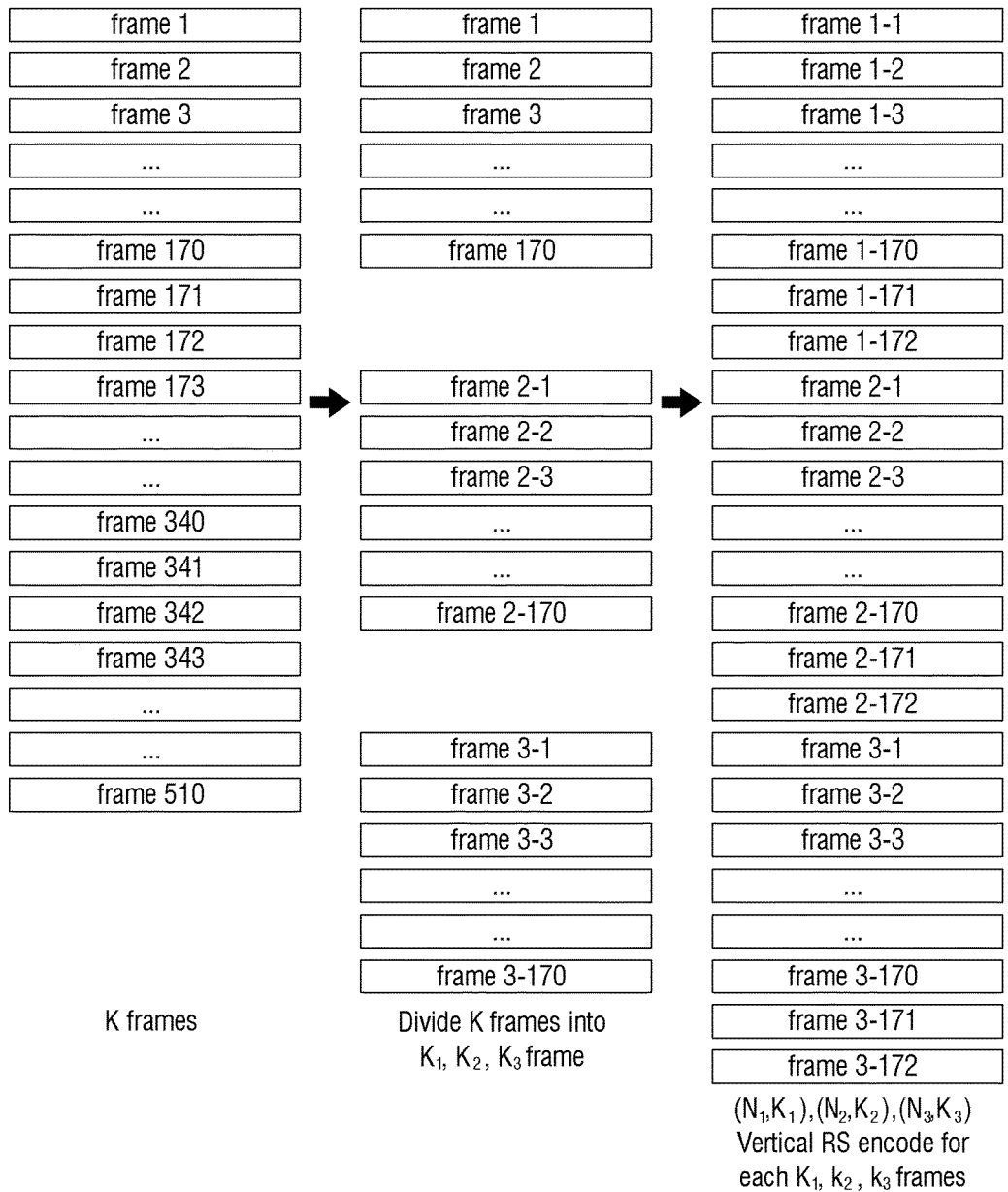

FIGS. 2 and 3 illustrate RS encoding according to exemplary embodiments of the inventive concept. More specifically, FIG. 2 shows an example of a method for performing RS encoding without dividing the plurality of frames into the plurality of groups, and FIG. 3 shows an example of a method for performing RS encoding by dividing the plurality of frames into the plurality of groups.

In FIG. 2, it is assumed that m which is defined in the $GF(2^m)$ field is 8, K which is the number of frames to perform RS encoding is 153, and N which is the number of RS-encoded frames is 155.

In this case, in the $GF(2^8)$ field, since the maximum number of frames that can be generated by RS encoding in the $GF(2^8)$ field becomes $(2^8-1)=255$, B which is the number of groups dividing 153 frames may be calculated to $$B = \left\lfloor \frac{155}{2^8-1} \right\rfloor + 1 = 1.$$

Accordingly, the frame encoder 110 may perform RS encoding on 153 frames without dividing the 153 frames into a plurality of groups as shown in FIG. 2. That is, the frame encoder 110 may perform RS encoding on the plurality of frames in the vertical direction using the RS(155, 153) code.

As a result of RS encoding, parities are added to the end of the last frame. In FIG. 2, since 153 frames are RS encoded using the RS(155, 153) code, parities are added to the end of the $153^{th}$ frame so that the $154^{th}$ and $155^{th}$ frames may be formed.

In FIG. 3, it is assumed that m which is defined in the $GF(2^m)$ field is 8, K which is the number of frames to perform RS encoding is 510, and N which is the number of RS-encoded frames is 516.

In this case, in the $GF(2^8)$ field, since the maximum number of frames that can be generated by RS encoding becomes $(2^8-1)=255$, B which is the number of groups to divide 510 frames may be calculated to $$B = \left\lfloor \frac{516}{2^8-1} \right\rfloor + 1 = 3.$$

Accordingly, the frame encoder 110 may divide 510 frames into three groups as shown in FIG. 3, and perform RS encoding on at least one frame included in each group.

In this case, the frame encoder 110 may set the number of frames for each group to perform RS encoding and the number of RS-encoded frames for each group in diverse methods.

For example, the three groups may be uniformly set to $(N_1, K_1)=(172, 170)$, $(N_2, K_2)=(172, 170)$, and $(N_3, K_3)=(172, 170)$. For another example, the three groups may be set to $(N_1, K_1)=(255, 252)$, $(N_2, K_2)=(255, 253)$, and $(N_3, K_3)=(6, 5)$, in which values of $N_1$ and $N_2$ except for $N_3$ may be set to the maximum value of 255, and $K_1$, $K_2$ and $K_3$ may be set to be similar to the ratio of (N, K). For still another example, the three groups may be set to $(N_1, K_1)=(255, 254)$, $(N_2, K_2)=(255, 254)$, and $(N_3, K_3)=(6, 2)$.

However, the above settings are merely examples. It is also possible to set $K_i$, the number of frames for each group to perform RS encoding, and $N_i$, the number of RS-encoded frames for each group, to other values.

In FIG. 3, the three groups are set to $(N_1, K_1)=(172, 170)$, $(N_2, K_2)=(172, 170)$ and $(N_3, K_3)=(172, 170)$. Accordingly, the frame encoder 110 may perform RS encoding on the plurality of frames of each group in the vertical direction using the RS(172, 170) code as shown in FIG. 3.

As a result of RS encoding, parities are added to the end of the last frame. In FIG. 3, since 170 frames included in each group are RS encoded using the RS(172, 170) code, parities generated in the first group (i.e., frame 1-1 to frame 1-170) are added to the end of the last frame of the first group so that the $171^{th}$ and $172^{th}$ frames may be formed in the first group.

Similarly, parities generated in the second group (i.e., frame 2-1 to frame 2-170) are added to the end of the last frame of the second group so that the $171^{th}$ and $172^{th}$ frames may be formed in the second group. Parities generated in the third group (i.e., frame 3-1 to frame 3-170) are added to the end of the last frame of the third group so that the $171^{th}$ and $172^{th}$ frames may be formed in the third group.

When the plurality of frames are divided into the plurality of groups and are RS encoded, the frame encoder 110 may interleave the RS-encoded frames. However, when the plurality of frames are RS encoded without being divided into the plurality of groups, the frame encoder 110 may not interleave the RS-encoded frames. As described above, the frame encoder 110 may perform interleaving selectively according to RS encoding methods.

Figure 4:
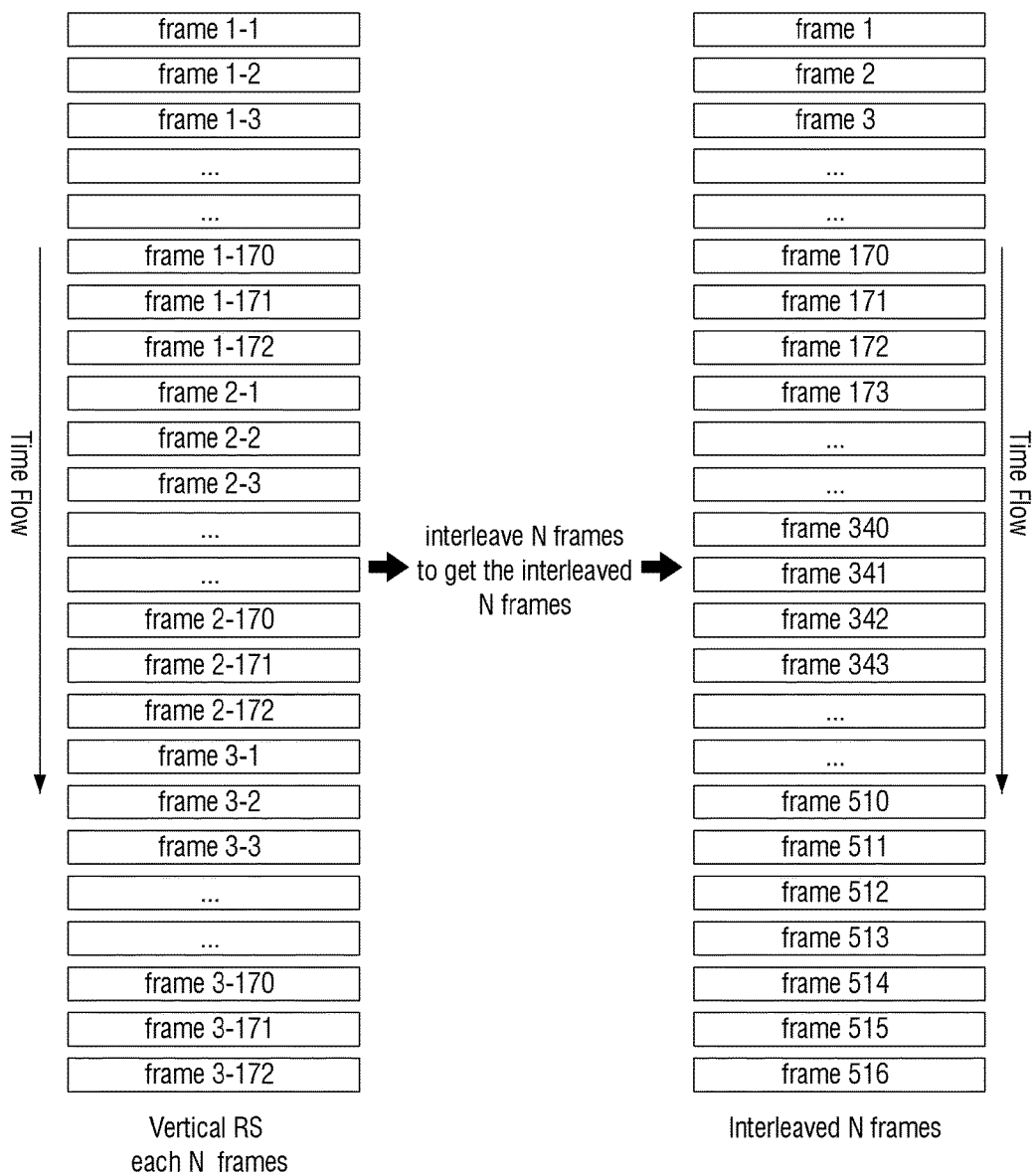
FIGS. 4 and 5 illustrate interleaving according to exemplary embodiments of the inventive concept.

For example, when 510 frames are divided into three groups and 170 frames in each group are RS encoded as in FIG. 3, the frame encoder 110 may interleave 516 RS-encoded frames including the original 510 frames and six parity frames in which parities are included so that the order of the frames is rearranged as shown in FIG. 4.

The frame encoder 110 may perform interleaving according to diverse interleaving rules.

For example, the frame encoder 110 may perform RS encoding for at least one frame in each group, generate at least one RS-encoded frame for each group, and perform interleaving by sequentially reading the at least one RS-encoded frame from each group. That is, the frame encoder 110 may perform interleaving by sequentially reading a predetermined number of frames from the groups and arranging the frames in the read order.

Figure 5:
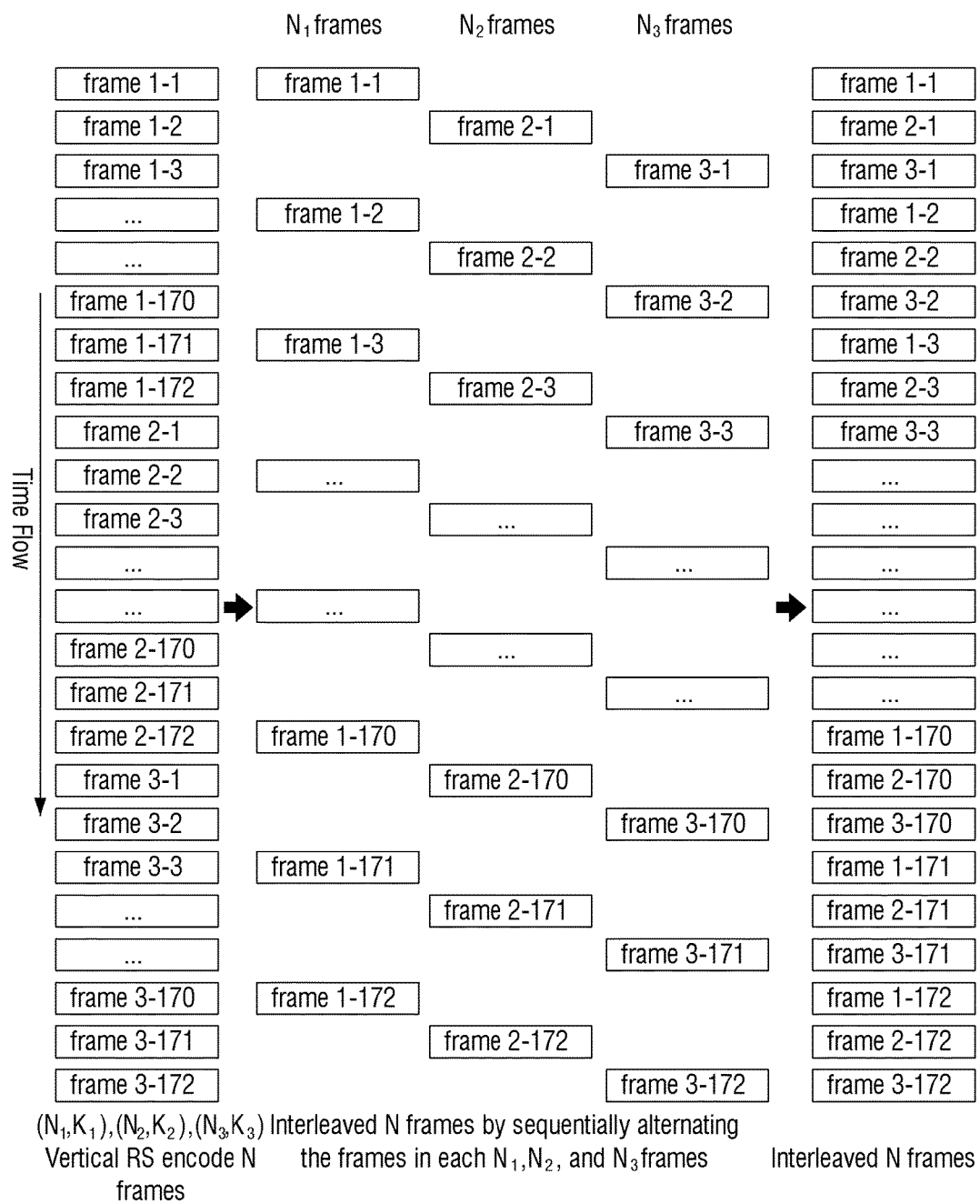

For example, as shown in FIG. 5, the frame encoder 110 may perform interleaving by sequentially reading one frame from each group.

That is, the frame encoder 110 reads the first frame (frame 1-1) from the first group including 172 frames, reads the first frame (frame 2-1) from the second group including 172 frames, reads the first frame (frame 3-1) from the third group including 172 frames, and sequentially arranges the read frames. That is, frame 1-1, frame 2-1, and frame 3-1 are sequentially arranged.

Subsequently, the frame encoder 110 reads the second frame (frame 1-2) from the first group, reads the second frame (frame 2-2) from the second group, reads the second frame (frame 3-2) from the third group, and sequentially arranges the read frames after the previously read frames. That is, frame 1-1, frame 2-1, frame 3-1, frame 1-2, frame 2-2, and frame 3-2 are sequentially arranged.

That is, the frame encoder 110 may rearrange the order of the RS-encoded frames by repeating the above interleaving process.

For another example, the frame encoder 110 may generate at least one RS-encoded frame for each group by performing RS encoding on at least one frame in each group, and perform interleaving by giving an index to the at least one RS-encoded frame for each group and changing the index of the at least one RS-encoded frame based on mathematical formula 2 as below.

$$i=(p \times j+D_{j \bmod Q}) \bmod N \quad (2)$$

where i is an index before interleaving, j is an index after interleaving, and P, Q, $D_0$, $D_1$, $D_2$, ..., and $D_{Q-1}$ are integers which are predetermined parameters.

In other words, the frame encoder 110 may perform interleaving by sequentially giving an index ranging from 0 to N−1 to each of the frames generated by RS encoding, and by changing the index of each frame based on mathematical formula 2. That is, the frame encoder 110 may perform interleaving using ordered pair (i,j) as indexes before and after interleaving.

For example, in the case of N=25, P=7, Q=3, $D_0$=23, $D_1$=5, and $D_2$=16, when 0 to 24 sequentially substitutes for j in mathematical formula 2, 23, 12, 5, 19, 8, 1, 15, 4, 22, 11, 0, 18, 7, 21, 14, 3, 17, 10, 24, 13, 6, 20, 9, 2 and 16 can be obtained for i.

In this example, when j is 0, i becomes 23 based on mathematical formula 2. Accordingly, a frame indexed with 23 is newly indexed with 0 so that the arrangement order may change.

As described above, the frame encoder 110 may rearrange the order of the encoded frames by changing the indexes given to the frames in the above method and arranging the frames in the changed index order.

Figure 6:
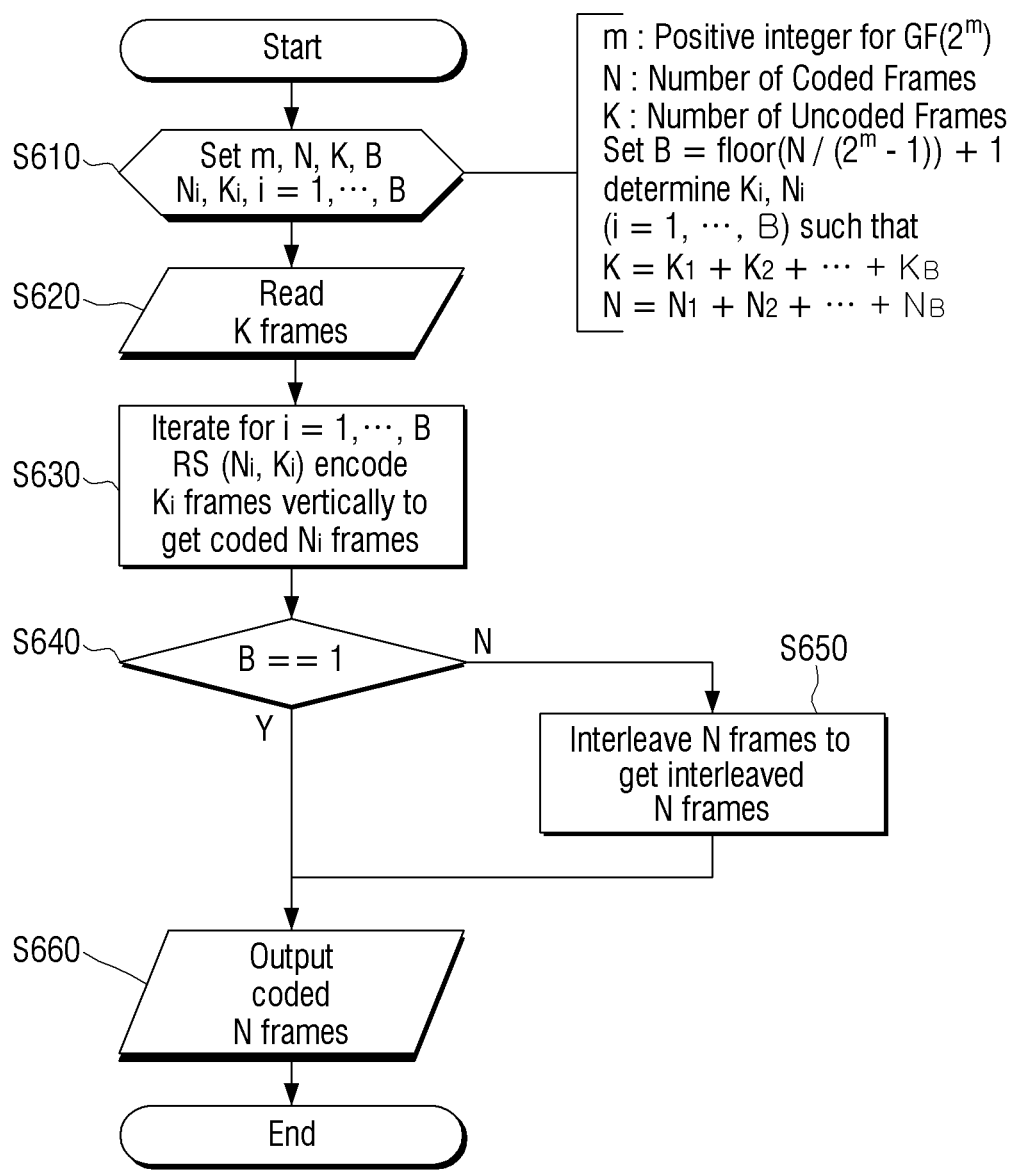
FIG. 6 is a flowchart to show a method for performing RS encoding on a frame basis according to an exemplary embodiment of the inventive concept.

FIG. 6 is a flowchart to show a method for performing RS encoding on a frame basis according to an exemplary embodiment of the inventive concept.

Firstly, diverse parameters are set to divide a plurality of frames into a plurality of groups (S610). That is, values of parameters m, N, K, B, $N_i$, and $K_i$ are set.

As described above, m is a positive integer defined in the Galois field, N is the number of the entire RS-encoded frames, K is the number of the entire frames to perform RS encoding, and B is the number of groups to divide the plurality of frames.

In addition, $N_i$ is the number of RS-encoded frames in each group, and $K_i$ is the number of frames to perform RS encoding in each group. In this case, when i is 1, 2, ..., and B, $N_i$ and $K_i$ may be set to satisfy $N=N_1+N_2+\cdots+N_B$, and $K=K_1+K_2+\cdots+K_B$.

Subsequently, K frames are read (S620), and $K_i$ frames are RS encoded in the vertical direction so that $N_i$ frames may be generated (S630). More specifically, $K_i$ frames which compose each of the first to the last groups are RS encoded in the vertical direction by substituting i for 1, 2, ..., and B so that encoded $N_i$ frames may be generated. When B is 1, RS encoding is performed without dividing the plurality of frames into a plurality of groups.

Subsequently, it is determined whether B is 1 (S640). That is, it is determined whether the plurality of frames are to be divided into a plurality of groups.

As a result, when B is 1 (S640—Y), it means that the plurality of frames are not to be divided into a plurality of groups. Accordingly, encoded N frames are output without interleaving (S660).

However, when B is not 1 (S640—N), it means that the plurality of frames are divided into a plurality of groups. Accordingly, the encoded N ($=N_1+N_2+\cdots+N_B$) frames are interleaved (S650).

Consequently, when B is 1, the RS-encoded N frames are output without interleaving, and when B is not 1, the interleaved N frames are output (S660).

Figure 7:
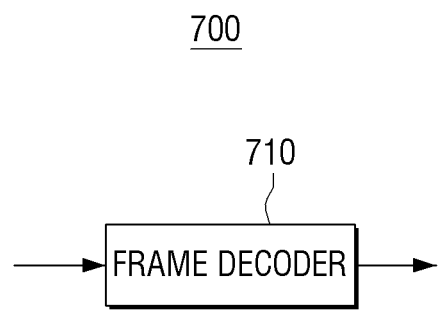
FIG. 7 is a block diagram of a configuration of a receiving apparatus according to an exemplary embodiment of the inventive concept.

FIG. 7 is a block diagram of a configuration of a receiving apparatus according to an exemplary embodiment of the inventive concept. With reference to FIG. 7, the receiving apparatus (or receiver) 700 may include a frame decoder 710. Although additional elements or components such as a demodulator and a constellation demapper may be included in the receiving apparatus 700, they are omitted in FIG. 7 for brevity of describing the frame decoder 710.

The frame decoder 710 corresponds to the frame encoder 110 of the transmitting apparatus 100, and thus performs operation corresponding to the operation of the frame encoder 110.

The frame decoder 710 performs vertical RS decoding on a plurality of RS-encoded frames received from the transmitting apparatus 100. In this case, the frame decoder 710 may divide the plurality of RS-encoded frames into a plurality of groups, and perform RS decoding for each divided group.

Specifically, the frame decoder 710 may divide the RS-encoded frames into the plurality of groups based on the number of the groups divided for the RS encoded frames, and perform RS decoding for each divided group in the vertical direction.

In other words, if the frame encoder 110 divides a plurality of frames into a plurality of groups and performs RS encoding, the frame decoder 710 may divide the RS-encoded frames into a plurality of groups based on the number of the groups divided for the plurality of frames, and perform vertical RS decoding for the RS-encoded frames in each group using the RS($N_i$, $K_i$) code applied to each group.

Herein, i is 1, 2, . . . , and B, B is the number of the groups divided for the plurality of frames, $N_i$ is the number of RS-encoded frames in each group, and $K_i$ is the number of frames on which RS encoding was performed in each group, at the transmitting apparatus 100.

In this case, the number of times being RS decoded may be the same as the number of the groups. For example, when the plurality of frames are divided into B groups, RS decoding is performed B times for $N_i$ frames using the RS($N_i$, $K_i$) code (I=1, 2, . . . , B).

If the frame encoder 110 performs RS encoding without dividing the plurality of frames into a plurality of groups, the frame decoder 710 may perform vertical RS decoding for the RS-encoded frames using the RS($N_i$, $K_i$) code. Herein, N is the number of the entire RS-encoded frames, and K is the number of the entire frames on which RS encoding was performed, the transmitting apparatus 100.

To do so, the frame decoder 710 may previously store information regarding diverse parameters, m, B, N, K, $N_i$, and $K_i$, which are used for RS encoding by the frame encoder 110 of the transmitting apparatus 100. In some cases, the information regarding parameters may be received from the transmitting apparatus 100.

As described above, the frame decoder 710 may perform RS decoding for the RS-encoded frames by or without dividing the plurality of frames into the plurality of groups, and thus generate the frames including information words.

On the other hand, the frame decoder 710 may perform deinterleaving before RS decoding. In other words, if the transmitting apparatus 100 divides the plurality of frames into a plurality of groups and performs RS encoding, the frame decoder 710 may deinterleave the RS-encoded frames. In this case, the frame decoder 710 may deinterleave the RS-encoded frames by reversely applying an interleaving rule applied for interleaving, and rearrange the frames in the order arranged before interleaving.

However, the frame encoder 110 may perform RS encoding without dividing the plurality of frames into a plurality of groups as described above. Accordingly, if the frame encoder 110 may perform RS encoding without dividing the plurality of frames into a plurality of groups, the frame decoder 710 may not perform deinterleaving.

More detailed description is provided below with reference to FIGS. 8 and 9.

Figure 8:
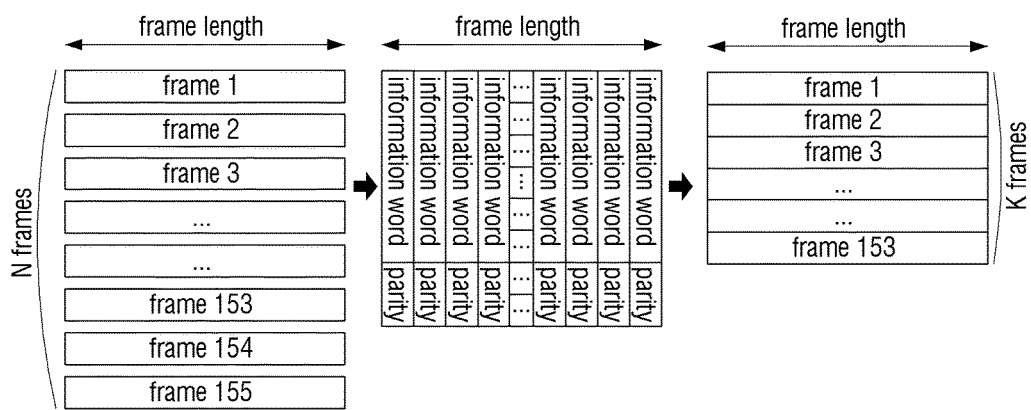
FIGS. 8 and 9 illustrate RS decoding according to exemplary embodiments of the inventive concept.
Figure 9:
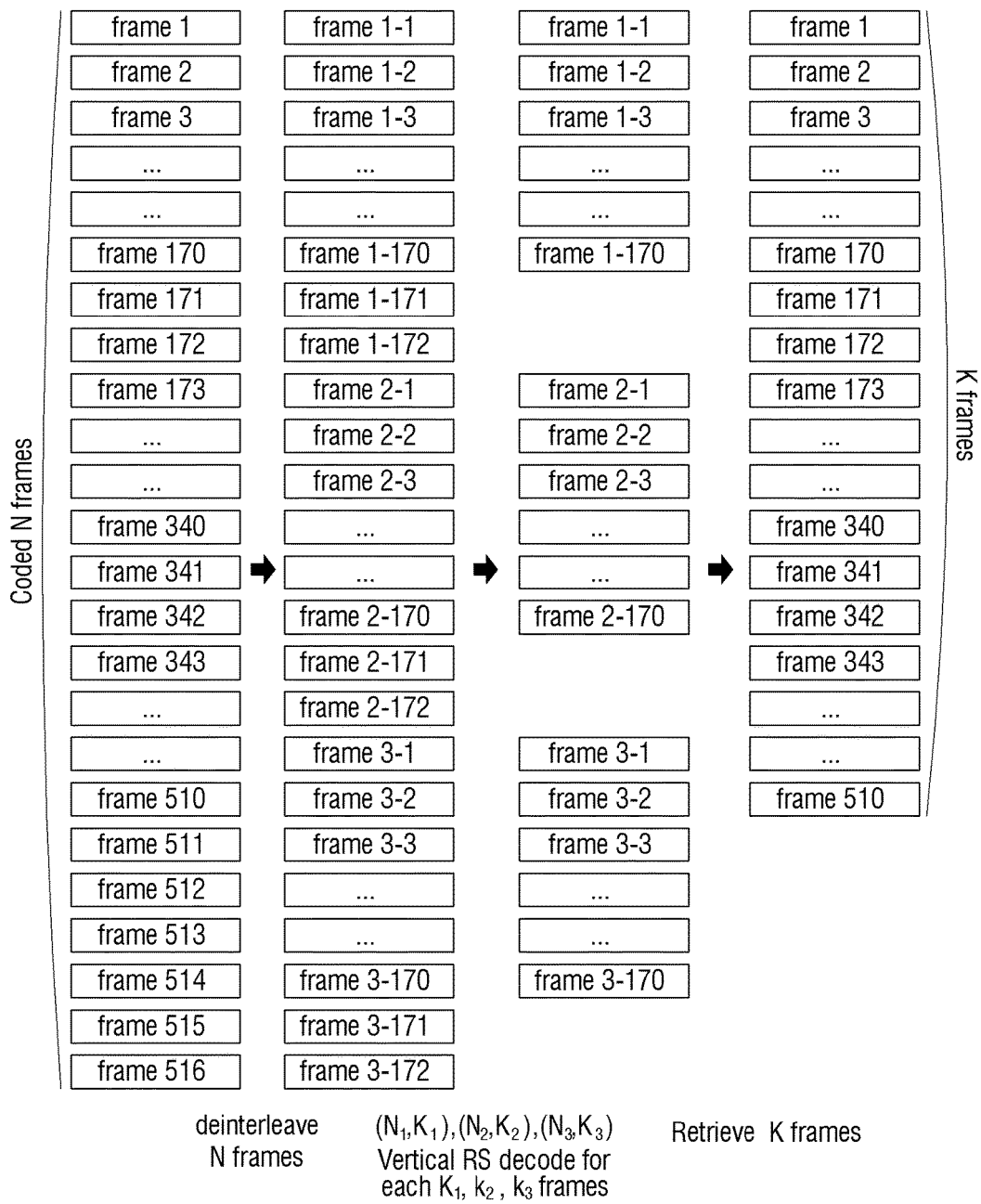

FIGS. 8 and 9 illustrate RS decoding according to exemplary embodiments of the inventive concept. More specifically, FIG. 8 shows an example of a method for performing RS decoding without dividing the RS-encoded frames into a plurality of groups, and FIG. 9 shows an example of a method for performing RS decoding by dividing the RS-encoded frames into the plurality of groups.

In FIG. 8, m defined in the GF($2^m$) field is 8, and the plurality of frames have been RS encoded in RS(155,153) code as in the example of FIG. 2.

In this case, the frame decoder 710 may perform RS decoding for 155 RS-encoded frames in the vertical direction without deinterleaving as shown in FIG. 8. As a result, the frame decoder 710 may obtain 153 frames including information words.

On the other hand, in FIG. 9, m defined in the GF($2^m$) field is 8 as shown in FIG. 3, the plurality of frames have been divided into three groups, and the three groups have been RS encoded using ($N_1$, $K_1$)=(172, 170), ($N_2$, $K_2$)=(172, 170), and ($N_3$, $K_3$)=(172, 170) codes and have been interleaved. Herein, N=172+172+172=516 and K=170+170+170=510 are satisfied.

In this case, the frame decoder 710 may deinterleave the 516 RS-encoded frames and rearrange the frames in the order arranged before interleaving as shown in FIG. 9. In addition, the frame decoder 710 may perform RS decoding for the first group using the ($N_1$, $K_1$)=(172, 170) code, for the second group using the ($N_2$, $K_2$)=(172, 170) code, and for the third group using the ($N_3$, $K_3$)=(172, 170) code, and thus may obtain 510 frames including information words. Here, the frame decoder 710 may remove parities added after the last frame of each group by the RS decoding for each group to obtain the information words.

Figure 10:
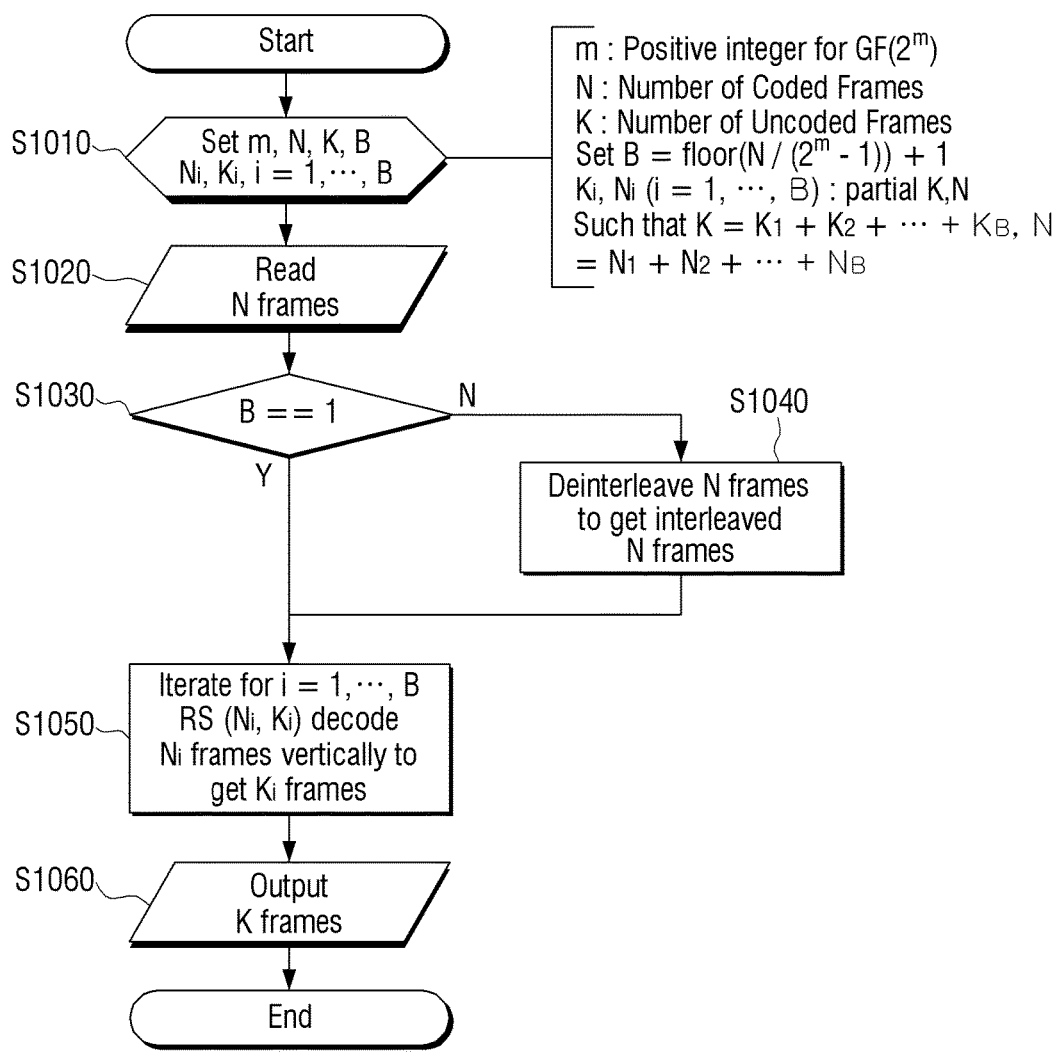
FIG. 10 is a flowchart to show a method for performing RS decoding on a frame basis according to an exemplary embodiment of the inventive concept.

FIG. 10 is a flowchart to show a method for performing RS decoding on a frame basis according to an exemplary embodiment of the inventive concept.

Firstly, diverse parameters are set to perform RS decoding for a plurality of RS-encoded frames (S1010). That is, values of parameters m, B, N, K, $N_i$, and $K_i$ are set.

As described above, m is a positive integer defined in the Galois field, N is the number of the entire RS-encoded frames, K is the number of the entire frames on which RS encoding was performed in a transmitting apparatus of the plurality of frames, and B is the number of groups divided for the plurality of frames.

In addition, $N_i$ is the number of RS-encoded frames in each group, and $K_i$ is the number of frames on which RS encoding was performed in each group. In this case, when i is 1, 2, . . . , and B, $N_i$ and $K_i$ may be set to satisfy N=$N_1$+$N_2$+ . . . +$N_B$, and K=$K_1$+$K_2$+ . . . +$K_B$.

Subsequently, N frames are read (S1020), and it is determined whether B is 1 (S1030). That is, it is determined whether the plurality of frames were divided into a plurality of groups and RS encoded.

As a result, if B is 1 (S1030—Y), it means that the transmitting apparatus 100 did not divide the plurality of frames into a plurality of groups. Accordingly, the encoded N frames are RS decoded without deinterleaving (S1050). In this case, the encoded N frames may be RS decoded in the vertical direction using the RS(N, K) code.

However, if B is not 1 (S1030—N), it means that that the transmitting apparatus 100 divided the plurality of frames into a plurality of groups. Accordingly, the encoded N frames are deinterleaved (S1040).

Subsequently, the deinterleaved N frames are divided into the plurality of groups, and the encoded $N_i$ frames of each group are RS decoded in the vertical direction using the RS(Ni, Ki) code (S1050).

Along this process, K frames including information words are output (S1060).

Figure 11A:
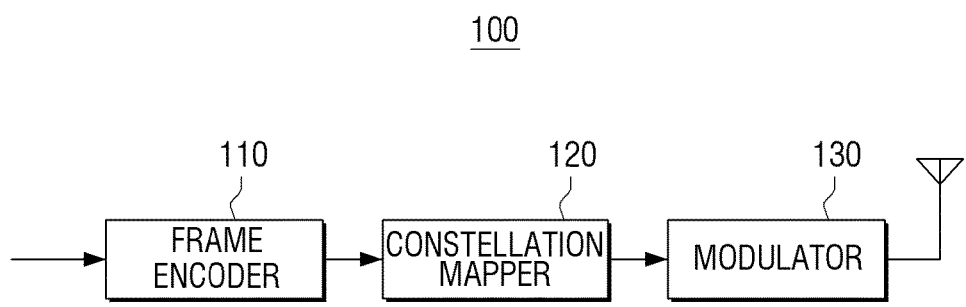
FIGS. 11A and 11B are block diagrams of detailed configurations of a transmitting apparatus and a receiving apparatus according to exemplary embodiments of the inventive concept.
Figure 11B:
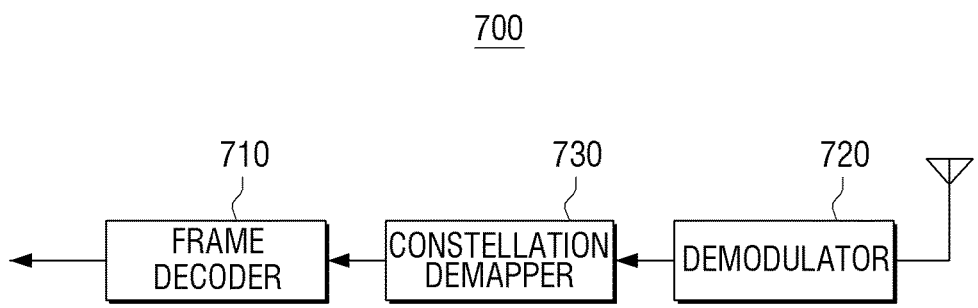

FIGS. 11A and 11B are block diagrams of detailed configurations of a transmitting apparatus and a receiving apparatus according to an exemplary embodiment of the inventive concept.

With reference to FIG. 11A, the transmitting apparatus 100 may include a frame encoder 110, a constellation mapper 120, and a modulator 130. Since the frame encoder 110 has the same function as described with reference to FIG. 1, detailed descriptions are not repeated.

The constellation mapper 120 maps an output of the frame encoder 110 onto a constellation. That is, the constellation mapper 120 may map bits which compose the RS-encoded frames onto the constellation.

To do so, the constellation mapper 120 may demultiplex the bits of the RS-encoded frames. In other words, the constellation mapper 120 may perform serial-to-parallel conversion on the bits of the RS-encoded frames, and generate cells (or parallel sequences) each of which includes a predetermined number of bits. The number of bits which are included in each cell may be the same as the number of bits which constitute a modulation symbol.

Subsequent to the demultiplexing of the bits of the RS-encoded frames, the constellation mapper 120 may map the demultiplexed bits onto the constellation. That is, the constellation mapper 120 may modulate the demultiplexed bits in diverse modulation methods such as QPSK, 16-QAM, 64-QAM, 256-QAM, 1024-QAM, and 4096-QAM, generate a modulation symbol, and map the modulation symbol onto a constellation point. In this case, since the demultiplexed bits constitute a cell including the number of bits in the modulation symbol, each cell may be mapped onto the constellation point.

The modulator 130 may modulate an output of the constellation mapper 120 and transmit the modulated output to the receiving apparatus 700. Specifically, the modulator 130 may perform single carrier modulation or multi-carrier modulation (e.g., orthogonal frequency division multiplexing (OFDM) or multi-carrier faster than Nyquist (MFTN)) for a signal which is mapped onto the constellation and which is output, perform radio frequency (RF) conversion and amplification for the modulated signal, and transmit the amplified signal to the receiving apparatus 700 over a channel allocated to a predetermined band.

With reference to FIG. 11B, the receiving apparatus 700 may include a frame decoder 710, a constellation demapper 730, and a demodulator 720. Since the frame decoder 710 has the same function as described with reference to FIG. 7, detailed descriptions are not repeated.

The demodulator 720 corresponds to the modulator 130 of the transmitting apparatus 100, and thus performs operations corresponding to the operations of the modulator 130.

That is, the demodulator 720 receives a signal from the transmitting apparatus 100 and demodulates the signal. More specifically, the demodulator 720 may convert a radio frequency (RF) signal received over a channel into a baseband signal, and demodulate the baseband signal.

The constellation demapper 730 corresponds to the constellation mapper 120 of the transmitting apparatus 100, and thus performs operations corresponding to the operations of the constellation mapper 120.

That is, the constellation demapper 730 demaps an output of the demodulator 720. Specifically, the constellation demapper 730 may demap the demodulated signal from the constellation and output a bit strip. In this case, the output of the constellation demapper 730 may include RS-encoded frames.

Figure 12A:
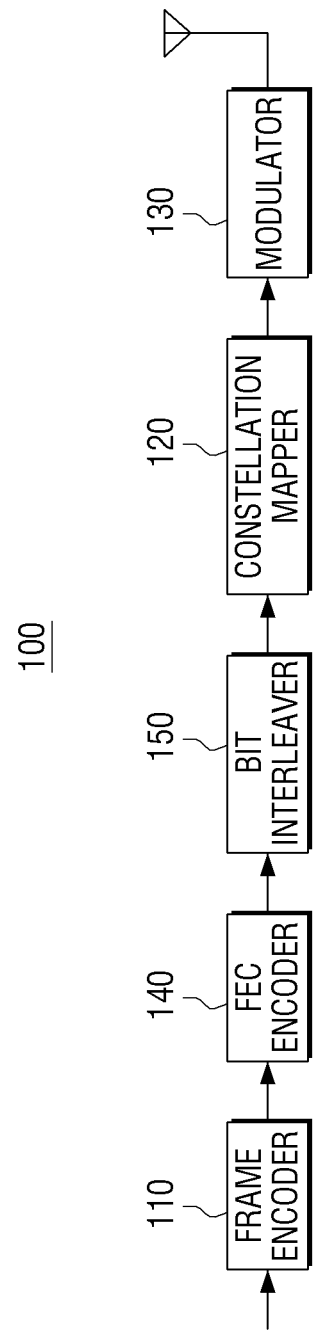
FIGS. 12A and 12B are block diagrams of detailed configurations of a transmitting apparatus and a receiving apparatus according to other exemplary embodiments of the inventive concept.
Figure 12B:
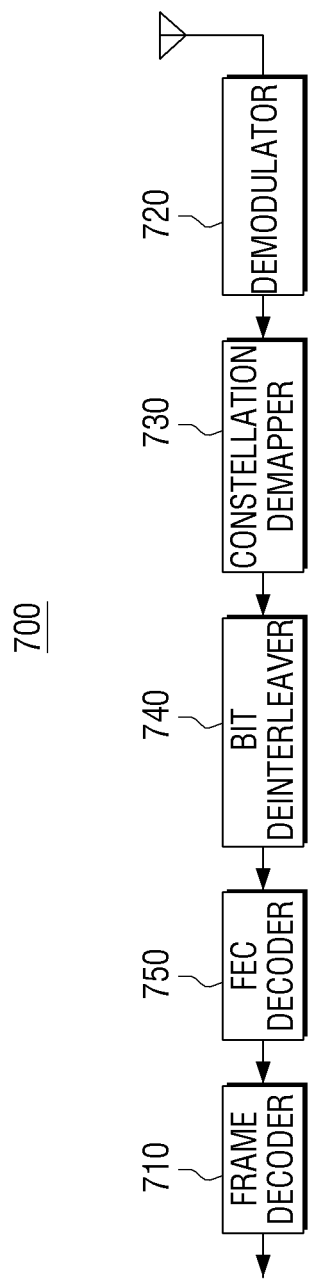

FIGS. 12A and 12B are block diagrams of detailed configurations of a transmitting apparatus and a receiving apparatus according to other exemplary embodiments of the inventive concept.

With reference to FIG. 12A, the transmitting apparatus 100 may include a frame encoder 110, a forward error correction (FEC) encoder 140, a bit interleaver 150, a constellation mapper 120, and a modulator 130. Since the frame encoder 110, the constellation mapper 120, and the modulator 130 have the same functions as described with reference to FIG. 11A, detailed descriptions are not repeated.

The FEC encoder 140 performs FEC encoding on the RS-encoded frames. For FEC encoding, a low density parity check (LDPC) code, a Bose Chaudhuri Hocquenghem (BCH) code, a convolutional code, or a turbo code may be used. In addition, the FEC encoder 140 outputs the FEC-encoded frames to the bit interleaver 150.

Specifically, the FEC encoder 140 may perform FEC encoding by using each of the RS-encoded frames as an information word. In other words, FEC encoding may be performed by using a single frame as the single FEC encoding unit. Accordingly, an FEC parity may be added to each frame. Detailed descriptions are provided with reference to FIG. 13.

With reference to FIG. 13, the FEC encoder 140 may perform FEC encoding on each of the RS-encoded N frames (frame 1 to frame 516).

That is, the FEC encoder 140 may perform FEC encoding on frame 1 as an information word, on frame 2 as an information word, . . . , and on frame 516 as an information word, so that FEC parity 1 may be added to frame 1, FEC parity 2 may be added to frame 2, . . . , and FEC parity 516 may be added to frame 516. Here, frames 511-516 may be parity frames 1-171, 1-172, 2-171, 2-172, 3-171 and 3-172 that have been generated at the frame encoder 110 by RS encoding on 510 input frames in the vertical direction.

In this method, the FEC encoder 140 may perform FEC encoding on the RS-encoded N frames by having a single frame as a single FEC encoding unit.

The bit interleaver 150 interleaves an output of the FEC encoder 140. In this case, the bit interleaver 150 may interleave the FEC-encoded frames using Nc columns which consist of Nr rows. Nc, the number of columns, and Nr, the number of rows, may vary according to the code rate or the modulation method.

Specifically, the bit interleaver 150 may perform bit interleaving by writing the bits of the FEC encoded frames output from the FEC encoder 140 from the first column to the Nc$^{th}$ column in the column direction, and by reading the first row to the Nr$^{th}$ row of the columns of the written bits in the row direction.

Subsequently, the bit interleaver 150 may output the interleaved frames to the constellation mapper 120. In this case, the constellation mapper 120 may map the bits of the bit-interleaved frames onto the cells.

As described above, the transmitting apparatus 100 may further include the FEC encoder 140 to perform encoding on the bit level, and the bit interleaver 150 to perform interleaving on a bit basis as in FIG. 12A.

With reference to FIG. 12B, the receiving apparatus 100 may include a frame decoder 710, an FEC decoder 750, a bit deinterleaver 740, a constellation demapper 730, and a demodulator 720. Since the frame decoder 710, the constellation demapper 730, and the demodulator 720 have the same functions as described with reference to FIG. 11B, detailed descriptions are not repeated.

The bit deinterleaver 740 corresponds to the bit interleaver 150 of the transmitting apparatus 100, and thus performs operations corresponding to the operations of the bit interleaver 150.

The bit deinterleaver 740 deinterleaves an output of the constellation demapper 730.

In this case, the bit deinterleaver 740 may deinterleave the FEC-encoded frames output from the constellation demapper 730 using Nr rows which consist of Nc columns.

Specifically, the bit deinterleaver 740 may perform deinterleaving by writing the bits of the FEC encoded frames from the first row to the Nr$^{th}$ row in the row direction, and by reading the first column to the Nc$^{th}$ column of the rows of the written bits in the column direction. Consequently, the bits may be rearranged in the same order as before being interleaved by the transmitting apparatus 100.

The FEC decoder 750 corresponds to the FEC encoder 140 of the transmitting apparatus 100, and thus performs operations corresponding to the operations of the FEC encoder 140.

The FEC decoder 750 may perform FEC decoding using a low density parity check (LDPC) code, a Bose Chaudhuri Hocquenghem (BCH) code, a convolutional code, or a turbo code. In addition, the FEC decoder 750 outputs the FEC-decoded frames to the frame decoder 710.

Specifically, the FEC decoder 750 may perform FEC decoding on each of the FEC-encoded frames. That is, since the transmitting apparatus 100 performs FEC encoding by using a single frame as the single FEC encoding unit, the FEC decoder 750 may perform FEC decoding on each frame.

In this case, the frame decoder 710 may perform RS decoding based on the result of FEC decoding.

Specifically, the frame decoder 710 may acquire information about frames having errors among the RS-encoded frames based on the result of FEC decoding, and perform RS decoding on the RS-encoded frames using the acquired information.

Since the FEC decoder 750 performs decoding on each frame as described above, the FEC decoder 750 may know information regarding whether errors are corrected on a frame basis as a result of FEC decoding. Accordingly, the frame decoder 710 may receive the information regarding whether errors are corrected on a frame basis from the FEC decoder 750.

When performing RS decoding on the RS-encoded frames on the frame level, the frame decoder 710 may determine a location and the number of frames having errors among the RS-encoded frames based on the information regarding whether errors are corrected on a frame basis. Accordingly, the frame decoder 710 may use an erasure decoding method to perform RS decoding on the RS-encoded frames.

In the case of FIG. 11B, since the frame decoder 710 cannot determine a location and the number of frames having errors among the RS-encoded frames, the frame decoder 710 may perform RS decoding on the RS-encoded frames using a random decoding method. Therefore, in the case of FIG. 12B, superior error correction performance may be provided for frame-level RS decoding.

Figure 14A:
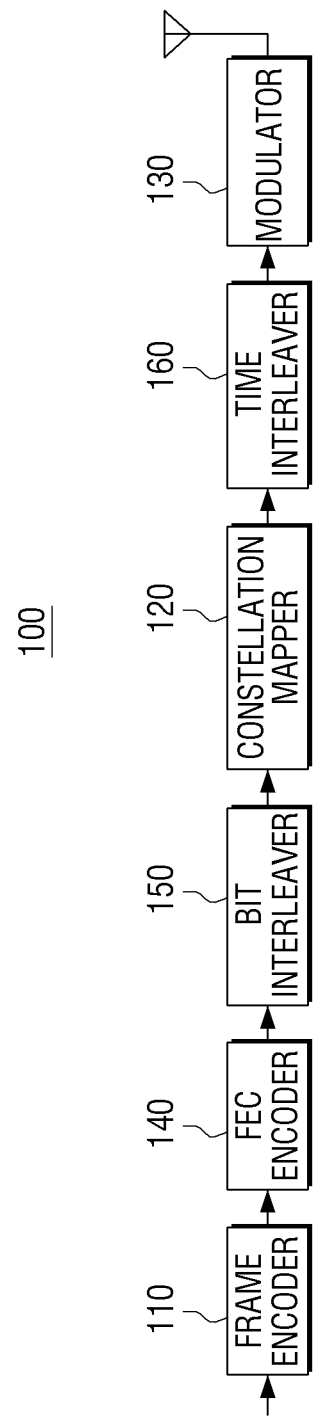
FIGS. 14A and 14B are block diagrams of detailed configurations of a transmitting apparatus and a receiving apparatus according to still other exemplary embodiments of the inventive concept.
Figure 14B:
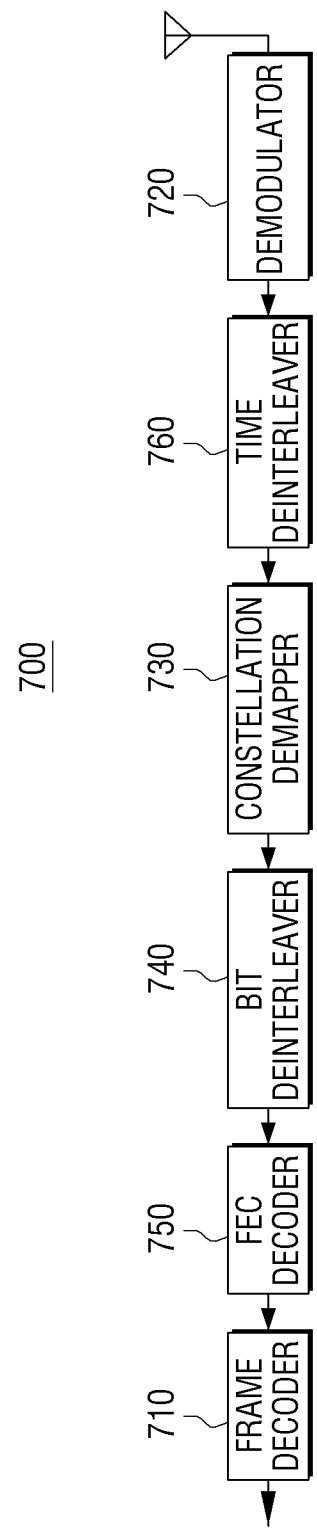

FIGS. 14A and 14B are block diagrams of detailed configurations of a transmitting apparatus and a receiving apparatus according to still other exemplary embodiment of the inventive concept.

With reference to FIG. 14A, the transmitting apparatus 100 may include a frame encoder 110, an FEC encoder 140, a bit interleaver 150, a constellation mapper 120, a time interleaver 160, and a modulator 130. Since the frame encoder 110, the FEC encoder 140, the bit interleaver 150, the constellation mapper 120, and the modulator 130 have the same functions as described with reference to FIG. 12A, detailed descriptions are not repeated.

The time interleaver 160 may interleave cells which are mapped onto constellation points and are output from the constellation mapper 120. In addition, the time interleaver 160 may output the interleaved cells to the modulator 130.

Detailed operations of the time interleaver 160 are described below.

As described above, the FEC encoder 140 performs FEC encoding by having each frame of a plurality of frames input to the FEC encoder 140 as a single FEC encoding unit, and the bit interleaver 150 interleaves the FEC-encoded frames on a bit basis. The bits of the bit-interleaved frames constitute cells, and are mapped onto constellation points by the constellation mapper 120.

Here, a set of cells mapped after bit-interleaving of the bits generated by a single FEC encoding may become an FEC block.

In this case, the time interleaver 160 may perform interleaving on a multiple number basis of the FEC block. In other words, at the n$^{th}$ time interleaving (or when the n$^{th}$ time interleaver performs time interleaving), the time interleaver 160 may rearrange the order of $N_{FEC\_TI}(n)$ FEC blocks. For example, in $N_{FEC\_TI}(1)=500$, the time interleaver 160 may interleave 500 FEC blocks at the first time interleaving. That is, the time interleaver 160 may interleave cells onto which the bits constituting 500 FEC blocks are mapped. The $N_{FEC\_TI}(n)$ FEC blocks may be a frame unit for interleaving. More details may be described later.

Accordingly, the frame encoder 110 may determine the number of frames to be RS encoded by RS encoding based on the aforementioned time interleaving rule. By this operation, RS-encoded frames of one group are prevented from being mixed with RS-encoded frames of another group when time interleaving is performed so that a receiving side of the frames may efficiently process the frames.

Specifically, the frame encoder 110 may determine the number of frames to be RS encoded by RS encoding based on mathematical formula 3 as below.

$$N=\Sigma N_{FEC-TI}(n) \quad (3),$$

where N is the number of frames to be RS encoded, and n is k, k+1, k+2, . . . , and k+z (k and z are natural numbers).

In this method, although time interleaving is performed, RS-encoded frames of one group are prevented from being mixed with RS-encoded frames of another group.

For example, it is assumed that time interleaver 160 interleaves $N_{FEC\_TI}(1)=500$, that is, 500 FEC blocks at the first time interleaving, interleaves $N_{FEC\_TI}(2)=10$, that is, 10 FEC blocks at the second time interleaving, and interleaves $N_{FEC\_TI}(3)=6$, that is, six FEC blocks at the third time interleaving.

In this case, the frame encoder 110 may perform RS encoding such that $N=N_{FEC\_TI}(1)+N_{FEC\_TI}(2)+N_{FEC\_TI}(3)=500+10+6=516$, that is, the RS-encoded frames become 516 frames. For example, the frame encoder 110 may perform RS encoding using an RS(516, 510) code.

Accordingly, the time interleaver 160 may perform interleaving in cells mapped with the bits of the FEC-encoded frames generated by performing FEC encoding on each of the RS-encoded frames generated by RS encoding.

With reference to FIG. 14B, the receiving apparatus 700 may include a frame decoder 710, an FEC decoder 750, a bit deinterleaver 740, a constellation demapper 730, a time deinterleaver 760, and a demodulator 720. Since the frame decoder 710, the FEC decoder 750, the bit deinterleaver 740, the constellation demapper 730, and the demodulator 720 have the same functions as described with reference to FIG. 12B, detailed descriptions are not repeated.

The time deinterleaver 760 may deinterleave output of the demodulator 720, and output a deinterleaved signal to the constellation demapper 730.

In this case, the time deinterleaver 760 corresponds to the time interleaver 160 of the transmitting apparatus 100, and thus performs operations corresponding to the operations of the time interleaver 160. Specifically, the time deinterleaver 760 may deinterleave cells interleaved by the time interleaver 160 and output the interleaved cells in the same order as before interleaving.

The transmitting apparatus 100 may further include a frame generator (not shown) to generate a frame and provide the generated frame to the frame encoder 110.

The frame generator (not shown) may generate a frame including a predetermined number of bits. The predetermined number of bits may represent an information word to transmit to the receiving apparatus 700.

Each component of the transmitting apparatus 100 and the receiving apparatus 700 may be implemented with a hardware module or a combination of hardware and software modules.

Figure 15:
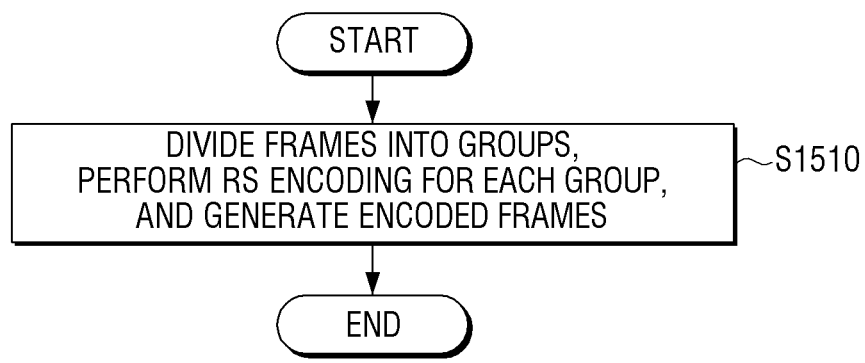
FIG. 15 is a flowchart to show an encoding method according to an exemplary embodiment of the inventive concept.

FIG. 15 is a flowchart to show an encoding method according to an exemplary embodiment of the inventive concept.

Firstly, RS encoding is performed on a plurality of frames in a vertical direction (S1510).

In this case, the plurality of frames may be divided into a plurality of groups, RS encoding may be performed for each group, and the RS-encoded frames may be generated.

More specifically, the plurality of frames may be divided into the plurality of groups based on the maximum number of frames that can be generated by RS encoding which is defined in a predetermined Galois field.

In other words, the plurality of frames may be divided into the plurality of groups when the number of frame to be RS encoded is greater than the maximum number of frames that can be generated by RS encoding which is defined in the predetermined Galois field. Specifically, the number of the groups to divide the plurality of frames may be calculated using mathematical formula 4 as below.

$$B = \left\lfloor \frac{N}{N'} \right\rfloor + 1, \quad (4)$$

where B is the number of groups to divide the plurality of frames, N is the number frames to be RS encoded, and N' is the maximum number of frames that can be generated by RS encoding which is defined in the predetermined Galois field.

In operation S1510, RS encoding may be performed for at least one frame included in each group in the vertical direction.

In operation S1510, the RS-encoded frames may be interleaved when the plurality of frames are divided into the plurality of groups and are RS encoded.

In this case, at least one RS-encoded frame for each group may be generated by performing RS encoding one at least one frame included in the each group, and interleaving may be performed by sequentially reading the at least one RS-encoded frame from each group.

Alternatively, the at least one RS-encoded frame for each group may be generated by performing RS encoding on at least one frame included in the each group, and interleaving may be performed by giving an index to the at least one RS-encoded frame generated for each group and changing the index of the at least one RS-encoded frame based on mathematical formula 5 as below.

$$i = (p \times j + D_{j \bmod Q}) \bmod N \quad (5),$$

where i is the index before interleaving, j is the index after interleaving, and P, Q, $D_0$, $D_1$, $D_2$, . . . , and $D_{Q-1}$ are predetermined parameters.

The method may further include performing FEC encoding on the RS-encoded frames.

The method may further include mapping bits of the FEC-encoded frames onto cells, and interleaving the cells mapped with the bits of the FEC-encoded frames. In this case, in operation S1510, the number of the RS-encoded frames generated by RS encoding may be determined based on the time interleaving operation.

Figure 16:
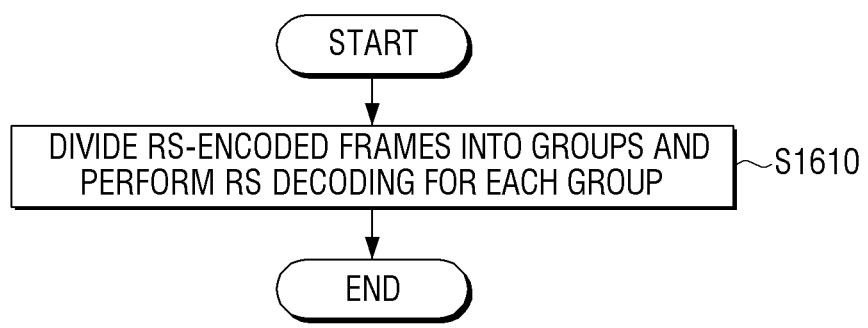
FIG. 16 is a flowchart to show a decoding method according to an exemplary embodiment of the inventive concept.

FIG. 16 is a flowchart to show a decoding method according to an exemplary embodiment of the inventive concept.

Firstly, RS decoding is performed for RS-encoded frames received from a transmitting apparatus in a vertical direction (S1610). In this case, the RS-encoded frames are divided into a plurality of groups, and RS decoding is performed for each group.

Specifically, the RS-encoded frames may be divided into the plurality of groups based on the number of groups that divided a plurality of frames to generated the RS-encoded frames, and vertical RS decoding may be performed for each group.

In S1610, the RS-encoded frames may be deinterleaved if the transmitting apparatus has divided a plurality of frames into a plurality of groups and performed RS encoding for each group.

The RS-encoded frames may have been FEC-encoded by the transmitting apparatus after RS encoding. In this case, the method may include performing FEC decoding on FEC-encoded frames.

In this case, in operation S1610, information about a frame having an error among the RS-encoded frames may be acquired based on a result of the FEC decoding, and RS decoding may be performed one the RS-encoded frames using the information about the frame having the error.

Figure 17A:
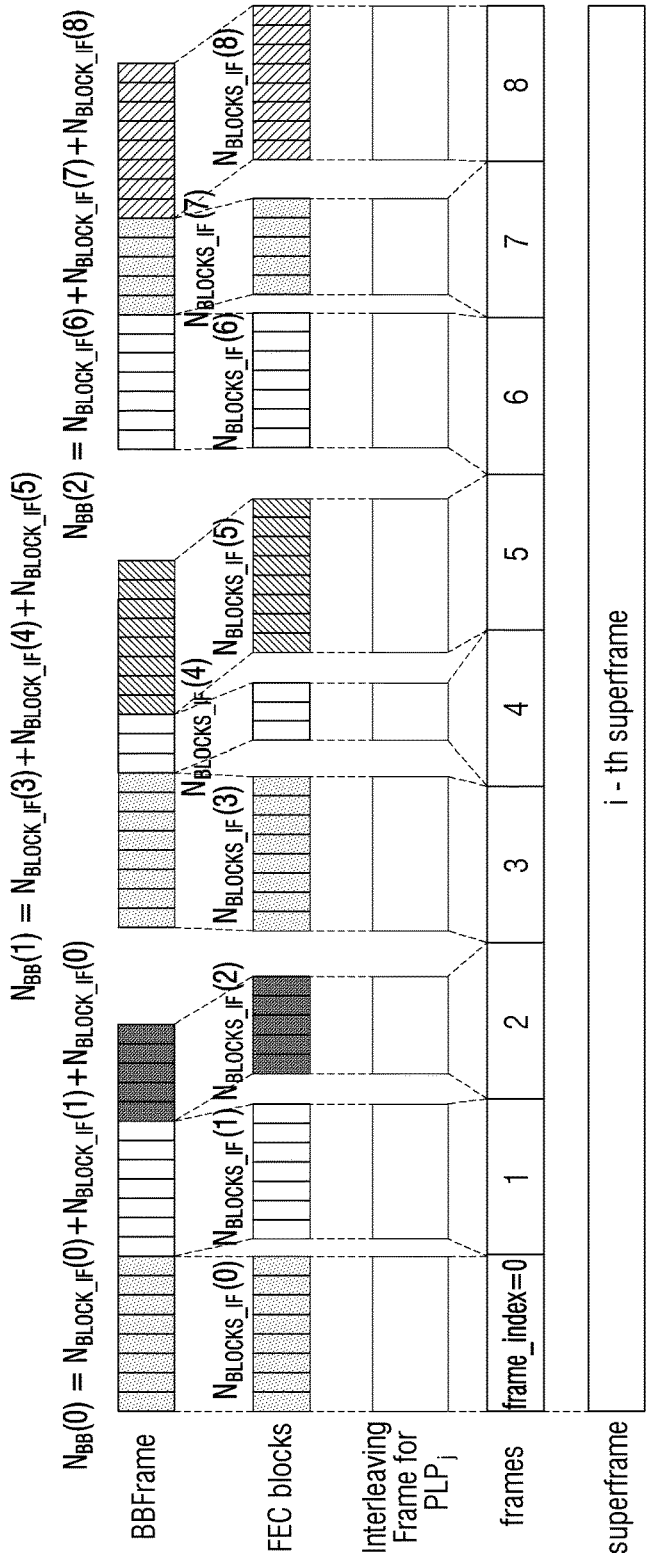
FIGS. 17A and 17B show transfer units of a transmitting apparatus and a receiving apparatus to transmit and receive a signal, respectively, according to exemplary embodiments of the inventive concept.
Figure 17B:
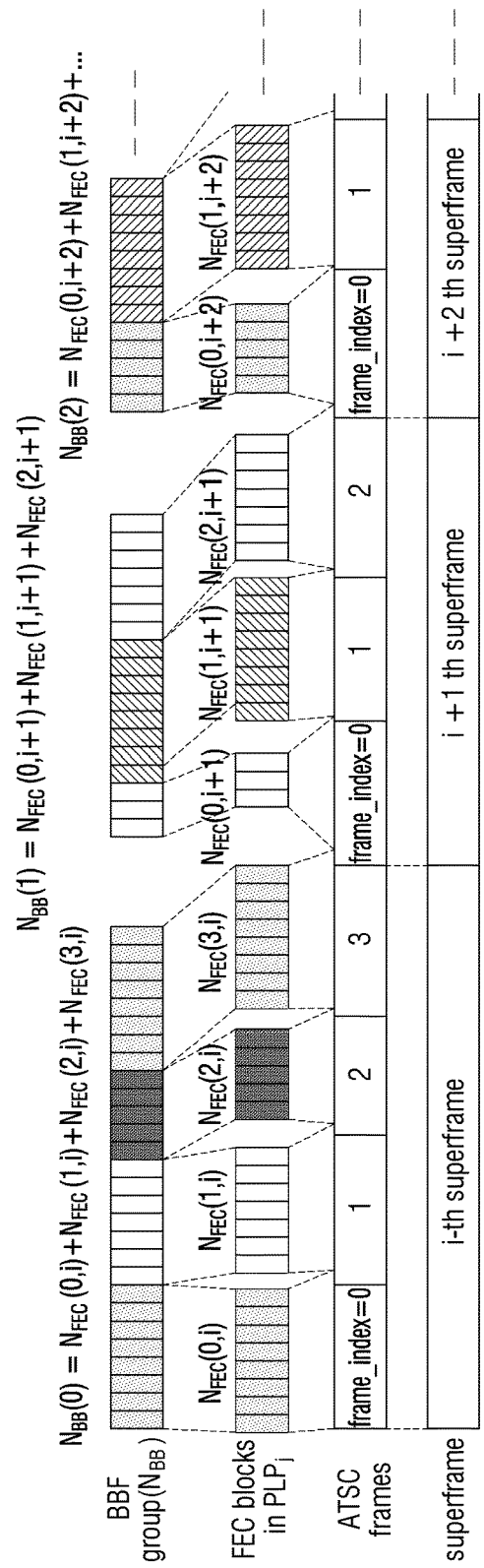

FIGS. 17A and 17B show transfer units of a transmitting apparatus and a receiving apparatus to transmit and receive a signal, respectively, according to exemplary embodiments of the inventive concept. FIGS. 17A and 17B are provided to describe frame units, that is, BB frames, which are encoded and decoded by the frame encoder 110 and the frame decoder 710, respectively, according to exemplary embodiments of the inventive concept.

With reference to FIG. 17A, a frame is a unit by which the transmitting apparatus 100 and the receiving apparatus 700 transmits and receives signals, respectively. Each frame is added with a frame index. For example, frame indexes from 0 to 8 may be provided repeatedly. In this case, a set of frames having frame indexes from 0 to 8 may be referred to as a super frame.

A single frame may include an interleaving frame for physical layer pipes (PLP). PLP indicates data to transmit or a signal processing route to transmit data.

Accordingly, the interleaving frame may be a unit by which the time interleaver 160 performs interleaving. Specifically, since the time interleaver 160 may perform interleaving on a multiple number basis of an FEC block as described above, each interleaving frame may include a plurality of FEC blocks. For example, an interleaving frame corresponding to a frame having the $0^{th}$ index may include $N_{BLOCKS\_IF}(0)=8$, that is, eight FEC blocks. The FEC block may be a set of cells that are mapped after bit-interleaving bits generated by a single FEC encoding.

One BB frame may include a multiple number of interleaving frames. For example, one BB frame may include three interleaving frames as shown in FIG. 17A.

Accordingly, the number of BB frames that are output from the frame encoder 110 or are input to the frame decoder 710 may be an integer multiple of interleaving frames. Detailed descriptions thereof have been provided with reference to FIG. 14A.

One BB frame may include a set of FEC blocks. That is, a BB frame may include a plurality of FEC blocks included in the integer multiple of interleaving frames. For example, a BB frame may include a plurality of FEC blocks included in each of three interleaving frames as shown in FIG. 17A. That is, $NBB(0)=N_{BLOCK\_IF}(0)+N_{BLOCK\_IF}(1)+N_{BLOCK\_IF}(2)$ may be satisfied.

With reference to FIG. 17A, in a single super frame, a plurality of BB frames processed by the frame encoder 110 and the frame decoder 710 may be generated.

However, this is merely an example. BB frames may be transmitted or received in diverse methods.

As shown in the example of FIG. 17B, a single BB frame may be generated in a single super frame. A single frame does not necessarily include a plurality of FEC blocks.

Figure 18A:
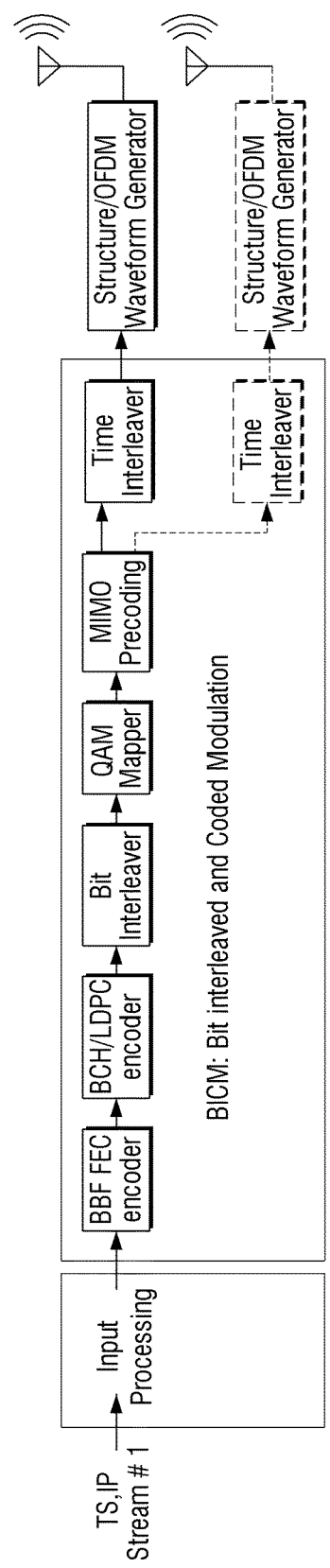
FIGS. 18A and 18B are block diagrams of a transmitting apparatus according to other exemplary embodiments of the inventive concept.
Figure 18B:
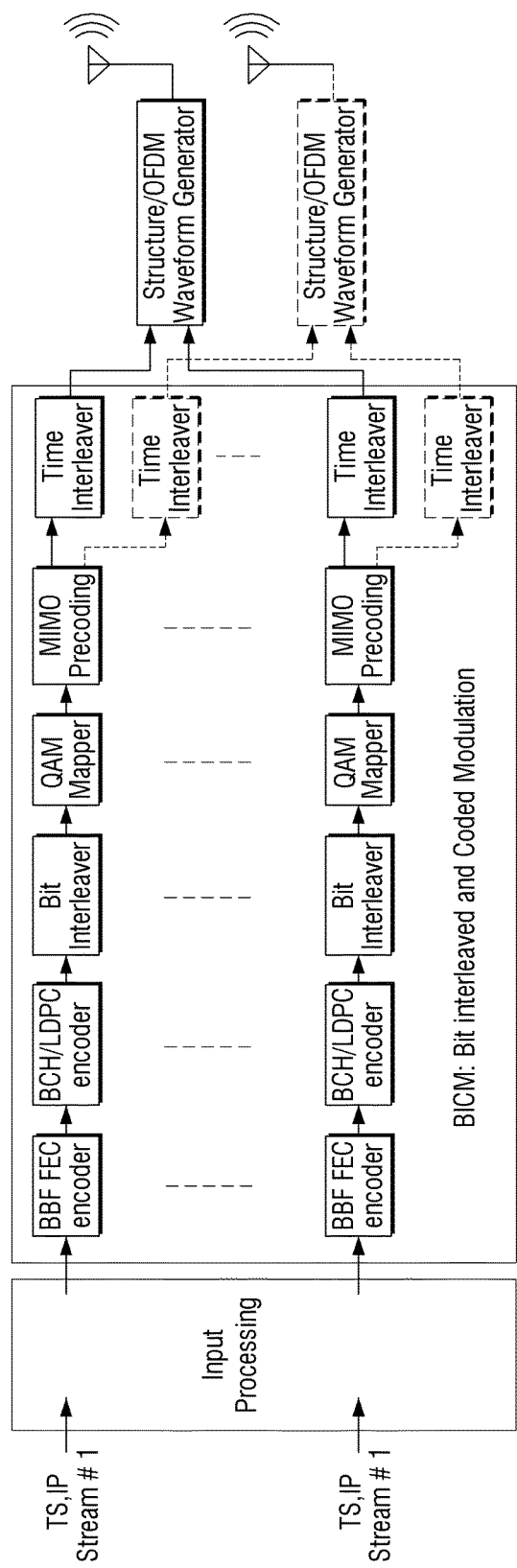

FIGS. 18A and 18B are block diagrams of a transmitting apparatus according to other exemplary embodiments of the inventive concept. In FIGS. 18A and 18B, a portion which is the same as what is explained for the transmitting apparatus 100 in the above is not explained again.

With reference to FIG. 18A, the transmitting apparatus may include an input processing module and a bit interleaved and coded modulation (BICM) module.

The input processing module performs preprocessing on data. The data is video or image, having a transport stream (TS) or internet protocol (IP) stream format.

More specifically, the input processing module may perform preprocessing for the data in a format which may be processed by the BICM module. For example, the input processing module may perform preprocessing on the data so as to have a frame format to be processed by a baseband frame (BBF) FEC encoder in the BICM module. The frame format processed by the BBF FEC encoder may be a BB frame format.

The BICM module may include the BBF FEC encoder, a BCH/LDPC encoder, a bit interleaver, a QAM mapper, a multiple input multiple output (MIMO) precoder (i.e., a module to perform MIMO precoding), and two time interleavers.

The BBF FEC encoder corresponds to the frame encoder 110 of the transmitting apparatus 100, the BCH/LDPC encoder corresponds to the FEC encoder 110, the bit interleaver corresponds to the bit interleaver 150, the QAM mapper corresponds to the constellation mapper 120, and the time interleavers correspond to the time interleaver 160. Accordingly, detailed descriptions are not repeated.

The MIMO precoder performs precoding on cells output from the QAM mapper for MIMO realization. For example, in this exemplary embodiment, since signals are transmitted to a receiving apparatus (e.g., 700) over two antennas, precoding may be performed using a predetermined size of matrix.

The transmitting apparatus consistent with FIG. 18A may include two modules (i.e., structure/OFDM waveform generators) to transmit cells output from the two time interleavers respectively to the receiving apparatus. The two modules may structuralize the time-interleaved cells, map the structuralized cells onto OFDM symbols, perform RF conversion and amplification, and transmit them to the receiving apparatus (e.g., 700). The two modules correspond to the demodulator 130 of the transmitting apparatus 100.

With reference to FIG. 18B, the transmitting apparatus shown in FIG. 18B has the same components as that shown in FIG. 18A.

However, there is a difference that the transmitting apparatus shown in FIG. 18B includes a plurality of component sets corresponding to signal processing routes. In other words, the transmitting apparatus shown in FIG. 18B includes a component set to process TS and IP stream #1, . . . , and a component set to process TS and IP stream #n.

In addition, the transmitting apparatus shown in FIG. 18B includes two structure/OFDM waveform generators as in the transmitting apparatus shown in FIG. 18a. In this case, a cell output to one time interleaver in a signal processing route to process TS and IP stream #1, . . . , and a cell output to one time interleaver in a signal processing route to process TS and IP stream #n may be input to one structure/OFDM waveform generator, and a cell output to the other time interleaver in the signal processing route to process TS and IP stream #1, . . . , and a cell output to the other time interleaver in the signal processing route to process TS and IP stream #n may be input to the other structure/OFDM waveform generator.

A non-transitory computer readable medium that stores a program to sequentially perform the encoding method and decoding method consistent with the inventive concept may be provided.

The non-transitory computer readable medium is a medium which does not store data temporarily such as a register, cash, and memory but stores data semi-permanently and is readable by electronic devices. More specifically, the aforementioned diverse applications or programs may be stored and provided in the non-transitory computer readable medium such as compact disks (CDs), digital video disks (DVDs), hard disks, Blu-ray disks, universal serial buses (USBs), memory cards, and read-only memory (ROM).

Components, elements or units represented by a block to constitute the transmitting apparatuses and receiving apparatuses in the above exemplary embodiments may be embodied as a various number of hardware, software and/or firmware structures that execute respective functions described above, according to exemplary embodiments. For example, these components, elements or units may use a direct circuit structure, such as a memory, processing, logic, a look-up table, etc. that may execute the respective functions through controls of one or more microprocessors or other control apparatuses. These components, elements or units may be specifically embodied by a module, a program, or a part of code, which contains one or more executable instructions for performing specified logic functions. In addition, in the block diagrams illustrating the transmitting apparatuses and the receiving apparatuses of the exemplary embodiments, a bus is not shown, but communication among the components, elements or units of the transmitting apparatuses or the receiving apparatuses may be performed over a bus.

The foregoing exemplary embodiments and advantages are merely exemplary and are not to be construed as limiting the inventive concept. The present teaching can be readily applied to other types of apparatuses. Also, the description of the exemplary embodiments of the inventive concept is intended to be illustrative, and not to limit the scope of the claims, and many alternatives, modifications, and variations will be apparent to those skilled in the art.

What is claimed is:

1. A transmitting apparatus comprising:
a frame encoder configured to divide a plurality of frames into a plurality of frame groups, and provide Reed Solomon (RS)-encoded frames by RS encoding each of the of the plurality of frame groups in a vertical direction for error correction; and
a transmitter configured to transmit a signal which is generated based on the RS-encoded frames,
wherein, if a number of the RS-encoded frames is greater than a maximum number of frames that can be generated by RS encoding in a predetermined Galois field, the frame encoder determines a number of the plurality of frame groups based on a number of the RS-encoded frames and the maximum number of frames that can be generated by RS encoding in a predetermined Galois field, and divides the plurality of frames into the plurality of frame groups based on the determined number of the plurality of frame groups, and
wherein the vertical direction is perpendicular to a direction in which bits are arranged in a frame of the plurality of frames, and
wherein the frame encoder is configured to calculate the number of the plurality of frame groups using a mathematical formula as below:

$$B = \left\lfloor \frac{N}{N'} \right\rfloor + 1,$$

where B is the number of the plurality of frame groups, N is the number of the RS-encoded frames, and N' is the maximum number of the frames that can be generated by RS encoding in the predetermined Galois field.

2. The transmitting apparatus as claimed in claim 1, wherein the frame encoder RS encodes the plurality of frames as many times as the number of the plurality of frame groups.

3. The transmitting apparatus as claimed in claim 1, wherein the frame encoder RS encodes at least one frame included in each frame group, in the vertical direction.

4. The transmitting apparatus as claimed in claim 1, wherein the frame encoder interleaves the RS-encoded frames if it is determined that the plurality of frames are divided into the plurality of frame groups and are RS encoded.

5. The transmitting apparatus as claimed in claim 4, wherein the frame encoder generates at least one RS-encoded frame for each frame group by performing RS encoding on at least one frame included in the each frame group, and performs interleaving by sequentially reading the at least one RS-encoded frame from the each frame group.

6. The transmitting apparatus as claimed in claim 4, wherein the frame encoder generates at least one RS-encoded frame for each frame group by performing RS encoding on at least one frame included in the each frame group, and performs interleaving by giving an index to the at least one RS-encoded frame for the each frame group and changing the index of the at least one RS-encoded frame for the each frame group based on a mathematical formula as below:

$$i = (p \times j + D_{j \bmod Q}) \bmod N,$$

where i is the index before the interleaving, j is the index after the interleaving, and P, Q, $D_0$, $D_1$, $D_2$, . . . , and $D_{Q-1}$ are predetermined parameters.

7. The transmitting apparatus as claimed in claim 1, further comprising a forward error correction (FEC) encoder configured to perform FEC encoding on the RS-encoded frames.

8. The transmitting apparatus as claimed in claim 7, further comprising:
a constellation mapper configured to map bits of the FEC-encoded frames onto cells; and
a time interleaver configured to interleave the cells mapped with the bits of the FEC-encoded frames,
wherein the frame encoder determines a number of frames to be RS encoded by the RS encoding, based on a time interleaving rule.

9. The transmitting apparatus as claimed in claim 8, wherein the time interleaving rule is represented by a mathematical formula as below:

$$N = \Sigma N_{FEC-TI}(n),$$

where N is the number of the frames to be RS encoded by the frame encoder, and n is k, k+1, k+2, . . . , and k+z (k and z are natural numbers).

10. A receiving apparatus comprising:
a frame decoder configured to divide a plurality of frames received from a signal transmitted by a transmitting apparatus into a plurality of frame groups and provide Reed Solomon (RS)-decoded frames by RS-decoding each of the plurality of frame groups in a vertical direction for error correction,
wherein, if a number of the RS-decoded frames is greater than a maximum number of frames that can be generated by RS encoding in a predetermined Galois field, the frame decoder determines a number of the plurality of frame groups based on a number of the RS-decoded frames and the maximum number of frames that can be generated by RS decoding in a predetermined Galois field, and divides the plurality of frames into the plurality of frame groups based on the determined number of the plurality of frame groups, and
wherein the vertical direction is perpendicular to a direction in which bits are arranged in a frame of the plurality of frames, and
wherein the frame decoder is configured to calculate the number of the plurality of frame groups using a mathematical formula as below:

$$B = \left\lfloor \frac{N}{N'} \right\rfloor + 1,$$

where B is the number of the plurality of frame groups, N is the number of the RS-decoded frames, and N' is the maximum number of the frames that can be generated by RS encoding in the predetermined Galois field.

11. The receiving apparatus as claimed in claim 10, wherein the frame decoder RS decodes the plurality of received frames as many times as the number of the plurality of frame groups.

12. The receiving apparatus as claimed in claim 10, wherein the frame decoder divides the plurality of received frames into the plurality of frame groups based on a number of frame groups that divided a plurality of frames at the transmitting apparatus for RS encoding for each frame group, and RS decodes the each frame group.

13. The receiving apparatus as claimed in claim 10, wherein the frame decoder deinterleaves the plurality of received frames if it is determined that the transmitting apparatus has divided a plurality of frames into the plurality of frame groups and performed RS encoding for each frame group so that parities are added after the last frame of the each frame group.

14. The receiving apparatus as claimed in claim 10, further comprising a forward error correction (FEC) decoder configured to perform FEC decoding on the plurality of received frames before the frame decoder RS decodes the plurality of received frames.

15. The receiving apparatus as claimed in claim 14, wherein the frame decoder acquires information about a frame having an error among the plurality of frames based on a result of the FEC decoding, and RS decodes the plurality of frames using the information about the frame having the error.

16. The receiving apparatus as claimed in claim 15, further comprising:
a time deinterleaver configured to deinterleave cells mapped with bits of the plurality of received frames; and
a constellation mapper configured to demap the bits of the plurality of received frames mapped onto the cells,
wherein the frame decoder determines a number of frames to be RS decoded by the RS decoding, based on a time interleaving rule.

17. The receiving apparatus as claimed in claim 16, wherein the time interleaving rule is represented by a mathematical formula as below:

$$N = \Sigma N_{FEC\text{-}TI}(n),$$

where N is a number of frames on which RS encoding is performed on the plurality of frames at the transmitting apparatus, and n is k, k+1, k+2, . . . , and k+z (k and z are natural numbers).

18. An encoding method comprising:
dividing a plurality of frames into a plurality of frame groups;
providing Reed Solomon (RS)-encoded frames by RS encoding each of the plurality of frame groups in a vertical direction for error correction; and
transmitting a signal which is generated based on the RS-encoded frames,
wherein, if a number of the RS-encoded frames is greater than a maximum number of frames that can be generated by RS encoding in a predetermined Galois field, the dividing determines a number of the plurality of frame groups based on a number of the RS-encoded frames and the maximum number of frames that can be generated by RS encoding in a predetermined Galois field, and divides the plurality of frames into the plurality of frame groups based on the determined number of the plurality of frame groups, and
wherein the vertical direction is perpendicular to a direction in which bits are arranged in a frame of the plurality of frames, and
wherein the dividing comprises calculating the number of the plurality of frame groups using a mathematical formula as below:

$$B = \left\lfloor \frac{N}{N'} \right\rfloor + 1,$$

where B is the number of the plurality of frame groups, N is the number of the RS-encoded frames, and N' is the maximum number of the frames that can be generated by RS encoding in the predetermined Galois field.

19. The method as claimed in claim 18, wherein the RS encoding is performed on the plurality of frames as many times as a number of the plurality of frame groups.

20. The method as claimed in claim 18, wherein the RS encoding is performed on at least one frame included in each frame group, in the vertical direction.

21. The method as claimed in claim 18, wherein the RS-encoded frames are interleaved if it is determined that the plurality of frames are divided into the plurality of frame groups and are RS-encoded.

22. The method as claimed in claim 21, wherein the RS encoding is performed such that at least one RS-encoded frame for each frame group is generated by performing RS encoding on at least one frame included in the each frame group, and interleaving is performed by sequentially reading the at least one RS-encoded frame from the each frame group.

23. The method as claimed in claim 21, wherein the RS encoding is performed such that at least one RS-encoded frame for each frame group is generated by performing RS encoding on at least one frame included in the each frame group, and interleaving is performed by giving an index to the at least one RS-encoded frame for the each frame group and changing the index of the at least one RS-encoded frame for the each frame group based on a mathematical formula as below:

$$i = (p \times j + D_{j \bmod Q}) \bmod N,$$

where i is the index before the interleaving, j is the index after the interleaving, and P, Q, $D_0$, $D_1$, $D_2$, . . . , and $D_{Q-1}$ are predetermined parameters.

24. The method as claimed in claim 18, further comprising:
performing forward error correction (FEC) encoding on the RS-encoded frames.

25. The method as claimed in claim 24, further comprising:
mapping bits of the FEC-encoded frames onto cells; and
interleaving the cells mapped with the bits of the FEC-encoded frames,
wherein a number of frames to be RS encoded by the RS encoding is determined based on a time interleaving rule.

26. The method as claimed in claim 25, wherein the time interleaving rule is represented by a mathematical formula as below:

$$N = \Sigma N_{FEC\text{-}TI}(n),$$

where N is the number of the frames to be RS encoded by the RS encoding, and n is k, k+1, k+2, . . . , and k+z (k and z are natural numbers).

27. A decoding method comprising:
dividing a plurality of frames received from a signal transmitted by a transmitting apparatus into a plurality of frame groups; and
provide Reed Solomon (RS)-decoded frames by RS decoding each of the plurality of frame groups in a vertical direction for error correction,
wherein, if a number of the RS-decoded frames is greater than a maximum number of frames that can be generated by RS decoding in a predetermined Galois field, the dividing determines a number of the plurality of frame groups based on a number of the RS-decoded frames and the maximum number of frames that can be generated by RS decoding in a predetermined Galois field, and divides the plurality of frames into the plurality of frame groups based on the determined number of the plurality of frame groups, and wherein the vertical direction is perpendicular to a direction in which bits are arranged in a frame of the plurality of frames;

wherein the dividing comprises calculating the number of the plurality of frame groups using a mathematical formula as below:

$$B = \left\lfloor \frac{N}{N'} \right\rfloor + 1,$$

where B is the number of the plurality of frame groups, N is the number of the RS-decoded frames, and N' is the maximum number of the frames that can be generated by RS encoding in the predetermined Galois field.

28. The method as claimed in claim 27, wherein the RS decoding is performed on the plurality of received frames as many times as a number of the plurality of frame groups.

29. The method as claimed in claim 27, wherein the dividing the plurality of received frames comprises dividing the RS-decoded frames into the plurality of frame groups based on a number of frame groups that divided a plurality of frames at the transmitting apparatus for RS encoding for each frame group.

30. The method as claimed in claim 27, further comprising: deinterleaving the plurality of received frames if it is determined that the transmitting apparatus has divided a plurality of frames into the plurality of frame groups and performed RS encoding for each frame group so that parities are added after the last frame of the each frame group.

31. The method as claimed in claim 27, further comprising performing forward error correction (FEC) decoding on the plurality of received frames prior to the RS decoding on the plurality of received frames.

32. The method as claimed in claim 31, further comprising acquiring information about a frame having an error among the plurality of received frames based on a result of the FEC decoding, wherein the acquired information is used for the RS decoding on the plurality of received frames.

33. The method as claimed in claim 32, further comprising:

deinterleaving cells mapped with bits of the plurality of received frames;

demapping the bits of the plurality of received frames mapped onto the cells; and determining a number of frames to be RS decoded by the RS decoding, based on a time interleaving rule.

34. The method as claimed in claim 33, wherein the time interleaving rule is represented by a mathematical formula as below:

$$N = \Sigma N_{FEC\text{-}TI}(n),$$

where N is a number of frames on which RS encoding is performed on the plurality of frames at the transmitting apparatus, and n is k, k+1, k+2, ..., and k+z (k and z are natural numbers).

* * * * *